(12) United States Patent
Kwak

(10) Patent No.: US 6,646,939 B2
(45) Date of Patent: Nov. 11, 2003

(54) LOW POWER TYPE RAMBUS DRAM

(75) Inventor: Jong Tae Kwak, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/206,702

(22) Filed: Jul. 26, 2002

(65) Prior Publication Data

US 2003/0021175 A1 Jan. 30, 2003

(30) Foreign Application Priority Data

Jul. 27, 2001 (KR) ......................................... 2001-45502

(51) Int. Cl.[7] ................................................ G11C 7/00
(52) U.S. Cl. ........................ 365/219; 365/227; 365/233
(58) Field of Search ................................. 365/233, 219, 365/227, 230.03, 230.06, 63

(56) References Cited

U.S. PATENT DOCUMENTS 6,310,814 B1 * 10/2001 Hampel et al. ............. 365/222
6,362,995 B1 * 3/2002 Moon et al. .................. 365/51
6,552,955 B1 * 4/2003 Miki ........................... 365/233
2001/0015934 A1 * 8/2001 Kwak ........................... 365/233

* cited by examiner

Primary Examiner—David Nelms
Assistant Examiner—Gene N. Auduong
(74) Attorney, Agent, or Firm—Ladas & Parry

(57) ABSTRACT

Disclosed is low power type Rambus DRAM including top/bottom memory bank units respectively comprising a plurality of banks for storing data, top and bottom serial/parallel shifter units, an interface logic circuit unit, a delay lock loop (DLL) unit and an input/output block unit. The top serial/parallel shifter unit is connected between the top memory bank unit and the input/output block unit and the bottom serial/parallel shifter unit is connected between the bottom memory bank unit and the input/output block unit. The interface logic circuit unit generates a signal for selecting the top or the bottom memory bank unit according to read or write command received from the external. The DLL unit generates a clock signal according to the signal outputted from the interface logic circuit unit. The input/output block unit generates a signal for selectively controlling the operation of top and bottom serial/parallel shifter units by buffering the clock signal generated from the DLL unit.

9 Claims, 15 Drawing Sheets

LOW POWER TYPE RAMBUS DRAM

BACKGROUND OF THE INVENTION

1. Field of the Invention

The present invention relates to Rambus DRAM, and more particularly, to Rambus DRAM capable of reducing power consumption by controlling top and bottom serial/parallel shifter blocks to independently operate according to received bank address.

2. Description of the Related Art

Generally, Rambus DRAM has two data storage areas and one I/O block for input/output, wherein data shifter blocks are connected to the data storage areas in one to one correspondence to interface therebetween.

FIG. 1 is a block diagram of Rambus DRAM according to conventional method, comprising an interface logic circuit unit 1, a DLL unit 2, an I/O unit 3, top serial/parallel shifter unit 4, bottom serial/parallel shifter unit 5, a top memory bank unit 6 and lower memory bank unit 7.

When Read command or Write command is applied from the external, the interface logic circuit unit 1 generates W1 signal in case of Write command and generates R1 signal in case of Read signal.

The DLL unit 2 generates W2 clock signals responding to the W1 signal received from the interface logic circuit unit 1 and generates R2 clock signal responding to the R1 signal received from the interface logic circuit unit 1.

The W2 signal and the R2 signal generated in the DLL unit 2 are applied to the I/O unit 3 and then, buffered into W3 and R3 signals The buffered W3 and R3 signals are applied to top and bottom serial/parallel shifter units 4 and 5, simultaneously.

The top and bottom serial/parallel shifter units 4 and 5 convert data received from the external into parallel data according to the W3 signal received from the I/O unit 3 in write operation, and convert parallel data received from the top and bottom memory bank units 6 and 7 into serial data according to the R3 signal received from the I/O unit 3 in read operation and output the result.

The conventional Rambus DRAM has top and bottom memory bank units 6 and 7 comprising 16 memory banks, wherein one of top and bottom memory bank units 6,7 is operated in one read or write operation.

However, according to the conventional Rambus DRAM, R3 and W3 signals, which are generated from the I/O unit 3, are simultaneously inputted to top and bottom serial/parallel shifter units 4 and 5 and thereby, both of them unnecessarily operate in read or write operation. Therefore, clock toggling is generated in one shifter block unnecessarily operating in read or write operation and power consumption is increased.

SUMMARY OF THE INVENTION

Therefore, the present invention has been made to solve the above problems and the object of the present invention is to provide Rambus DRAM reducing power consumption by controlling top and bottom serial/parallel shifter blocks to independently operate according to received bank address.

In order to accomplish the above object, the present invention comprises: a top memory bank unit comprising a plurality of banks for storing data; a bottom memory bank unit comprising a plurality of banks for storing data; a top serial/parallel shifter unit connected between the top memory bank unit and input/output block unit for converting data received by read or write command into serial or parallel data and outputting the result; and a bottom serial/parallel shifter unit connected between the bottom memory bank unit and input/output block unit for converting data received by read or write command into serial or parallel data and outputting the result, the Rambus DRAM including an interface logic circuit unit for generating first read clock signal R1 and top read selection signal R_top or bottom read selection signal R_bot for selecting the top or the bottom memory bank unit according to read command received from the external and generating first write clock signal W1 and top write selection signal W_top or bottom write selection signal W_bot for selecting the top or the bottom memory bank unit according to write command received from the external; a delay lock loop (DLL) unit for receiving the first write clock signal W1 to generate first write clock signal W2 and receiving the first read clock signal R1 to generate synchronized second read clock signal R2; and an input/output block unit for generating signals for selectively controlling the operation of top serial/parallel shifter unit or bottom serial/parallel shifter unit by buffering the first write clock signal W2 or the first read clock signal R2 received from the DLL according to the top read selection signal R_top, the bottom read selection signal R_bot, the top write selection signal W_top and the bottom write selection signal W_bot received from the interface logic circuit unit.

DETAILED DESCRIPTION OF THE DRAWINGS

The above objects, and other features and advantages of the present invention will become more apparent after reading the following detailed description when taken in conjunction with the drawings.

Figure 1:
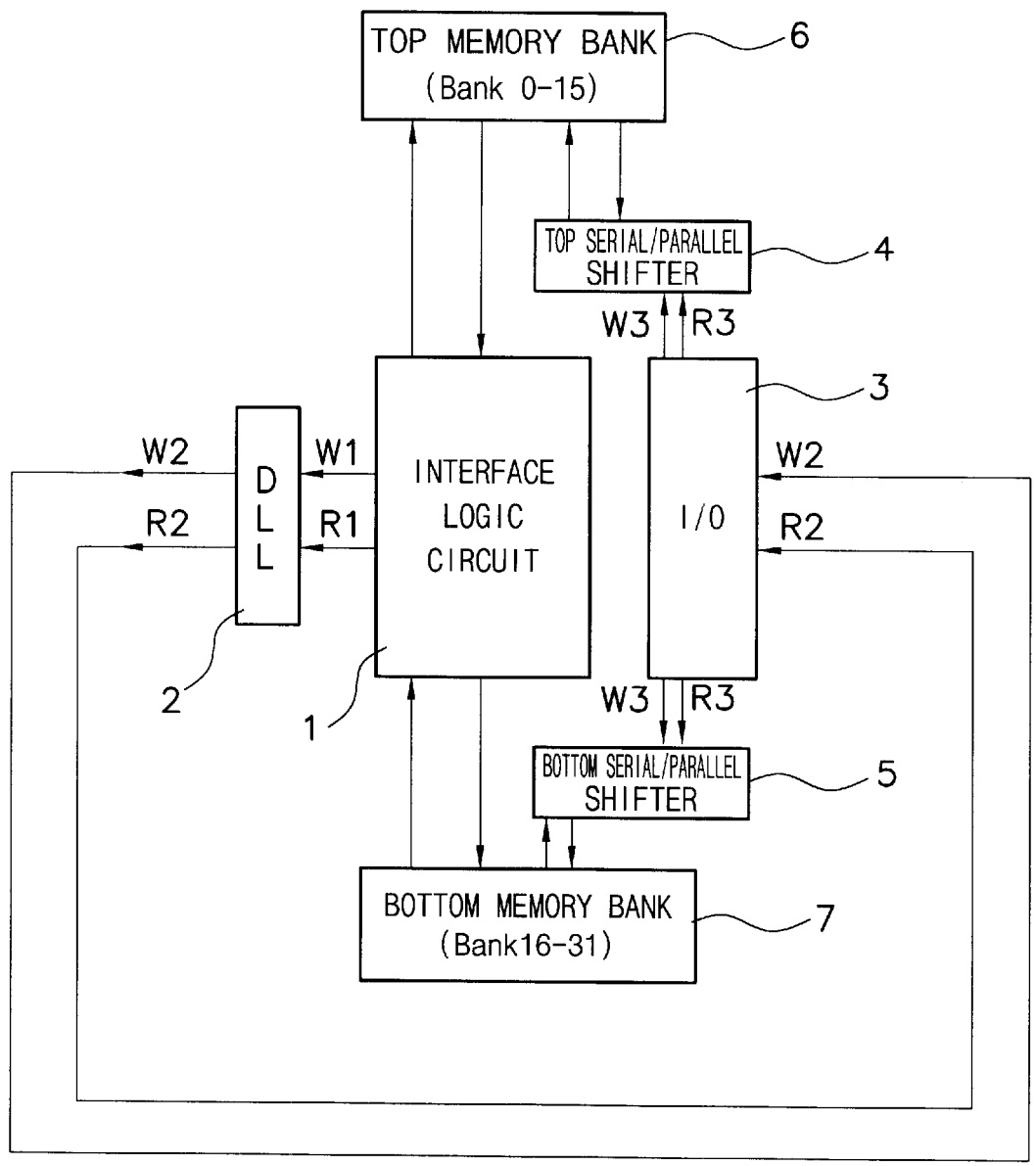
FIG. 1 is a block diagram of Rambus DRAM according to conventional art.
Figure 2:
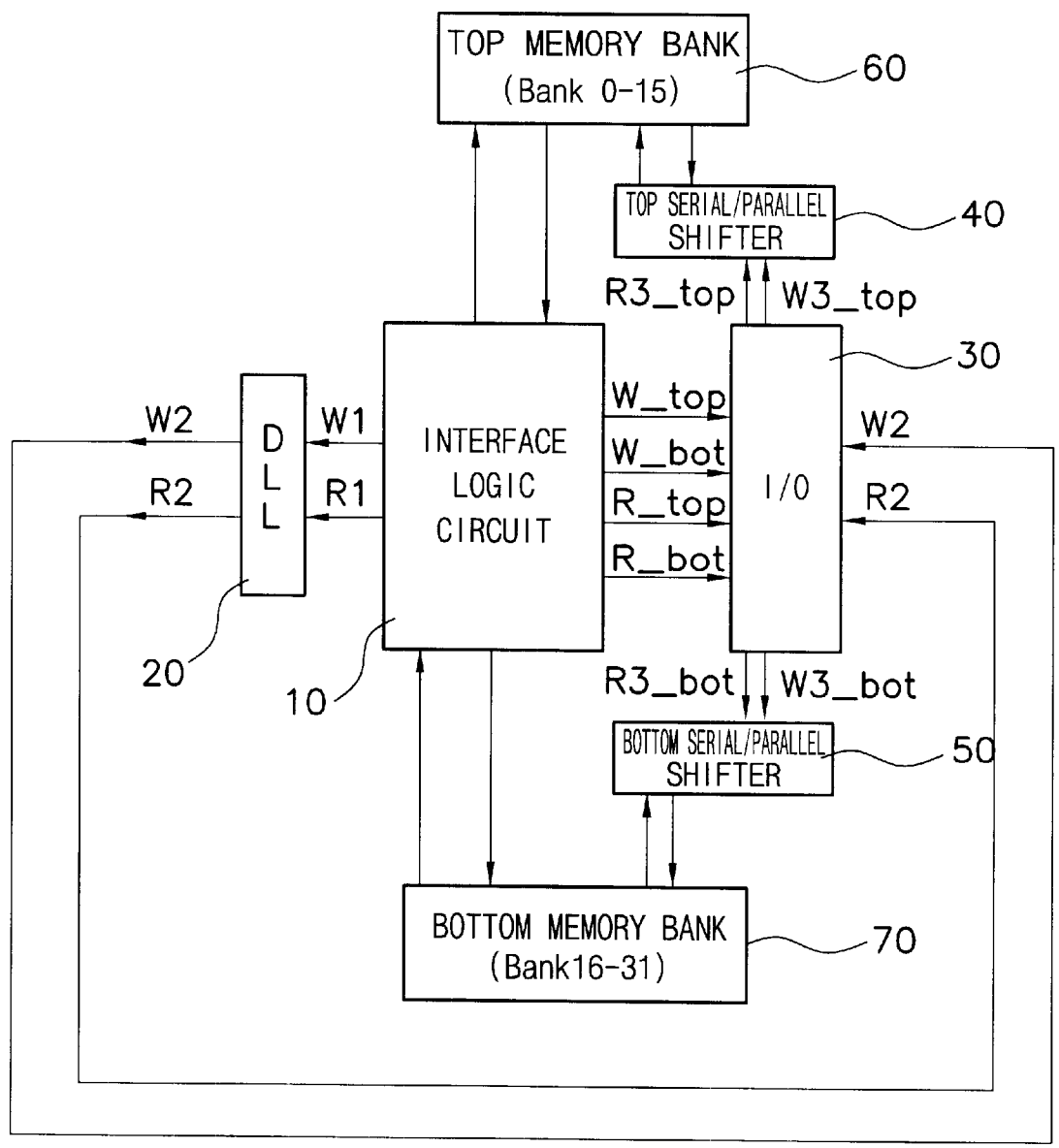
FIG. 2 is a block diagram of Rambus DRAM according to the present invention.

FIG. 2 is a block diagram of low power type Rambus DRAM according to the present invention comprising: upper and lower memory bank units 60 and 70 including 16 banks for storing data respectively; an interface logic circuit unit 10 for generating R1 signal when read command is received from the external and for generating W1 signal and W_top signal or W_bot signal when write command is received from the external; a DLL unit 20 for receiving the W1 signal from the interface logic circuit unit 10 to generate W2 clock signal and for receiving the R1 signal to generate R2 clock signal; an I/O unit 30 for generating W3_top signal by buffering the W2 signal received from the DLL unit 20 when the W_top signal is received from the interface logic circuit unit 10, for generating W3_bot signal by buffering the W2 signal received from the DLL unit 20 when the W_bot signal is received from the interface logic circuit unit 10, for generating R3_top signal by buffering the R2 signal received from the DLL unit 20 when the R_top signal is received from the interface logic circuit unit 10, and for generating R3_bot signal by buffering the R2 signal received from the DLL unit 20 when the R_bot signal is received from the interface logic circuit unit 10; a top serial/parallel shifter unit 40 for converting serial data received through the I/O unit 30 into parallel data according to W3_top signal received from the I/O unit 30 and transmitting the converted parallel data to the top memory bank unit 60, and then converting parallel data received from the top memory bank unit 60 into serial data according to the R3_top signal received from the I/O unit 30 and transmitting the converted serial data to the I/O unit 30; and a bottom serial/parallel shifter unit 50 for converting serial data received through the I/O unit 30 into parallel data according to W3_bot signal received from the I/O unit 30 and transmitting the converted parallel data to the bottom memory bank unit 70, and then for converting parallel data received from the bottom memory bank unit 70 into serial data according to R3_bot signal received from the I/O unit 30 and transmitting the converted serial data to the I/O unit 30.

Generally, when read or write command is applied from the external, an address is applied with the command to indicate whether the command is to the top memory bank unit 60 or to the bottom memory bank unit 70. The address is applied to bank address area through RQ pin and it becomes a command for selecting the bottom memory bank unit 60 if the address has a value in the range of 0 to 15 and it becomes a command for selecting the top memory bank unit 70 if the address has a value in the range of 16 to 31.

Referring to FIG. 2, the interface logic circuit unit 10 generates enable signals W_top, W_bot, R_top, R_bot for selectively driving the top or bottom memory bank unit 60 or 70 to the I/O unit 30 referring to the applied bank address. The interface logic circuit unit 10 generates write clock signal W3_top to top serial/parallel shifter unit 40 when the received command is write command and the received bank address signal has a value in the range of 16 to 31, and generates write clock signal W3_bot to bottom serial/parallel shifter unit 50 when the received command is write command and received bank address signal has a value in the range of 0 to 15. And, the interface logic circuit unit 10 generates read clock signal R3_top to top serial/parallel shifter unit 40 when the received command is read command and the received bank address signal has a value in the range of 16 to 31, and generates read clock signal R3_bot to bottom serial/parallel shifter unit 50 when the received command is read command and the received bank address signal has a value in the range of 0 to 15.

If read/write command is applied to top memory bank unit 60, only the enable signal R_top and W_top become 'logic high' and are toggled. On the other hand, the enable signal R_bot and W_bot are not toggled and set to 'high'.

The I/O unit 30 buffers the first write clock signal W2 or the first read clock signal R2 received from the DLL unit 10 according to the read clock signal R_top, R_bot and the write clock signal W_top, W_bot received from the interface logic circuit unit 10 and then, generates signals for selectively controlling operations of the top serial/parallel shifter unit 40 or the bottom serial/parallel shifter unit 50. That is, the I/O unit 30 generates read clock signal R3_top and write signal W3_top to the top serial/parallel shifter unit 40 and generates read clock signal R3_bot and write clock signal W3_bot to the bottom serial/parallel shifter unit 50.

The top serial/parallel shifter unit 40 converts serial data received from the I/O unit 30 into parallel data according to write clock signal W3_top received from the I/O unit 30 and transmits the result to the top memory bank unit 60, and then converts parallel data received from the top memory bank unit 60 into serial data according to read clock signal R3_top received from the I/O unit 30 and transmits the result to the I/O unit 30.

The bottom serial/parallel shifter unit 50 converts serial data received from the I/O unit 30 into parallel data according to write clock signal W3_bot received from the I/O unit 30 and transmits the result to the bottom memory bank unit 70, and then converts parallel data received from the bottom memory bank unit 70 into serial data according to read clock signal R3_bot received from the I/O unit 30 and transmits the result to the I/O unit 30.

Therefore, in the present invention, it is possible to control top or bottom serial/parallel shifter block, respectively and operate one serial/parallel shifter memory bank block and thereby, reducing power consumption.

Figure 3:
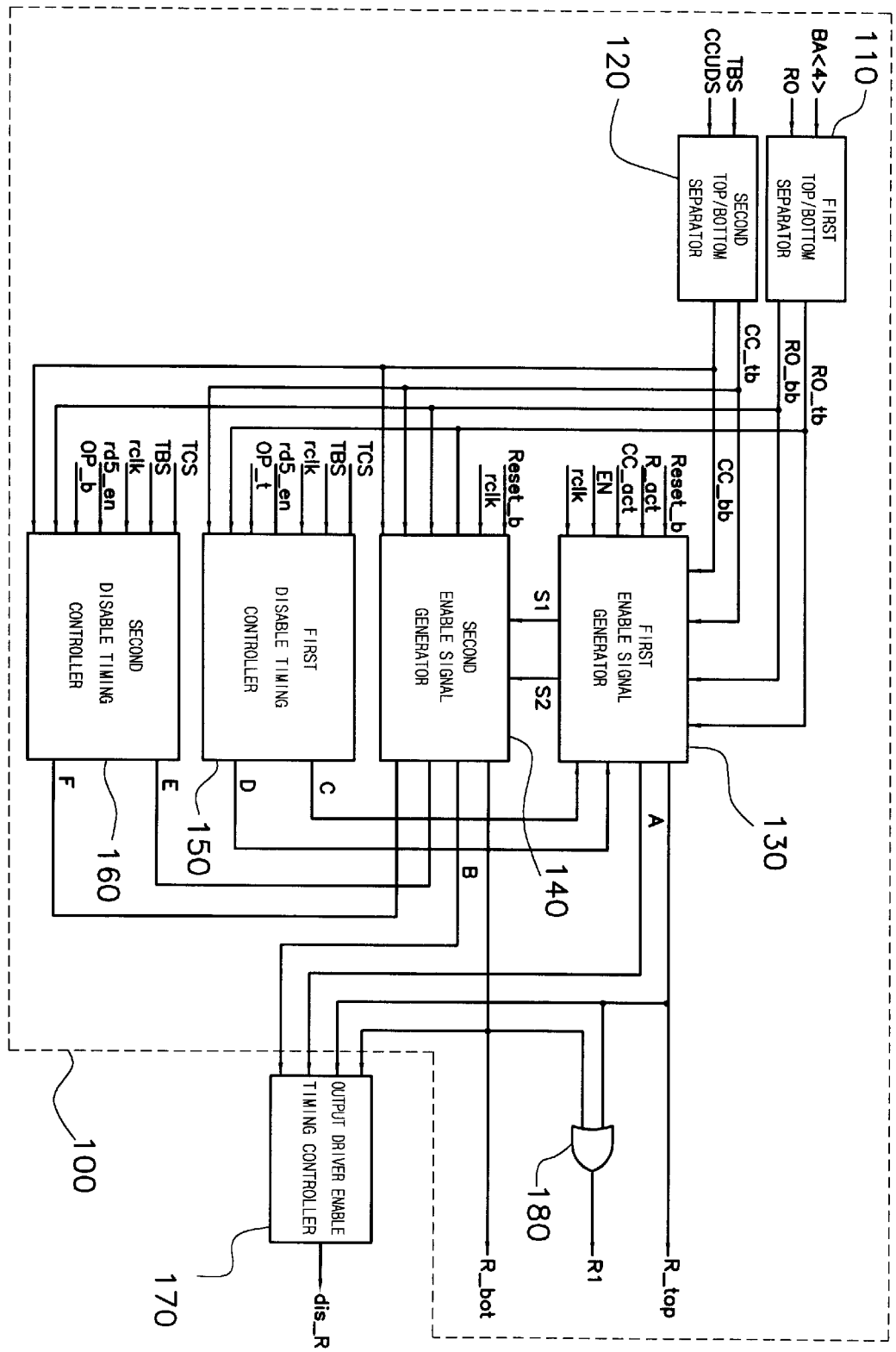
FIG. 3 is a block diagram of interface logic circuit unit in FIG. 2, showing the operation path by current control command and read command.

FIG. 3 is a block diagram of interface logic circuit unit 10, showing the operation path by current control command and read command.

Referring to FIG. 3, the interface logic circuit unit 10 includes an enable control unit 100 for controlling to enable one of top read clock signal R_top and bottom read clock signal R_bot according to bank address received with read or current control command, and an output driver enable timing control unit 170 for controlling to disable the enabled top read clock signal R_top or bottom read clock signal R_bot after a predetermined time.

The enable control unit 100 comprises a first and a second top/bottom separation units 110 and 120, a first and a second enable signal generation units 130 and 140, a first and a second disable timing control units 150 and 160 and an OR gate unit 180.

The first top/bottom separation units 110 receives and command signal RO and maximum valid bit signal BA<4> of bank address and then, generates internal read command signal RO_tb and RO_bb for separating top and bottom memory banks.

When the current control update selector signal CCUDS and read command finally received are signals for selecting top part of memory, the second top/bottom separation unit 120 receives a top banks selector signal TBS set to 'logic high' and generates internal current control command signal CC_tb and CC_bb for selecting top or bottom serial/parallel shifter units 40 and 50 used in a prior read command when a current command is performed.

The first enable signal generation unit 130 receives internal read command signal RO_tb and RO_bb from the first top/bottom separation unit 110, internal current control command signal CC_tb and CC_bb from the second top/bottom separation unit 120, reset bar signal Reset_b, read active signal R_act, current command active signal CC_act, control signal EN and clock signal rclk and then, generates top read clock signal R_top to the top serial/parallel shifter unit 40 when read or current command is applied to top memory bank unit 60.

The second enable signal generation unit 140 receives internal read command signal RO_tb and RO_bb from the first top/bottom separation unit 110, internal current command signal CC_tb and CC_bb from the second top/bottom separation unit 120, the reset bar signal Reset_b and the clock signal rclk and signals S1, S2 from the first enable signal generation unit 130, and then generates bottom read clock signal R_bot to the bottom serial/parallel shifter unit 50 when read or current command for the bottom memory bank unit 70 is received.

The first disabling timing control unit 150 receives internal read command signal RO_tb from the first top/bottom separation unit 110, internal current control command signal CC_tb from the second top/bottom separation unit 120, timing control signal TCS, top bank selection signal TBS, clock signal rclk, clock signal rd5_en and control signal OP_t and then, generates first and second timing control signals C and D to the first enable signal generation unit 130 for disabling the top read clock signal R_top outputted from the first enable generation unit 130 after a predetermined time.

The second disable timing control unit 160 receives internal read command signal RO_bb from the first top/bottom separation unit 110, internal current control command signal CC_bb from the second top/bottom separation unit 120, timing control signal TCS, top bank selection signal TBS, clock signal rclk, clock signal rd5_en and control signal OP_b and generates first and second timing control signal E and F to the second enable signal generation unit 140 for disabling the bottom read clock signal R_bot outputted from the second enable signal generation unit 140 after a predetermined time.

The OR gate unit 180 generates enable signal R1 having 'logic high' when one of the top read clock signal R_top received from the first enable signal generation unit 130 and the bottom read clock signal T_bot received from the second enable signal generation unit 140, is enabled.

Referring to FIGS. 2 and 3, the operation will be described in more detail.

The output driver enable timing control unit 170 receives the top read clock signal R3_top and output signal A generated from the first enable signal generation unit 130, and the bottom read clock signal R3_bot and output signal B generated from the second enable signal generation unit 140, and generates signal dis_R for enabling output driver and disabling the output driver after a predetermined time when one of the top read clock signal R3_top and the bottom read clock signal R3_bot is enable.

The first top/bottom separation unit 110 generates internal command signal RO_tb and RO_bb according to internal read command signal RO and maximum valid bit signal BA<4> of bank address when read command is received from the external. If address for the top memory is applied, the maximum bit signal BA<4> of bank address becomes '1' and only internal read command signal RO_tb of the internal read command signals RO_tb and RO_bb becomes active to '0'.

The second top/bottom separation unit 120 separates top and bottom memory banks by receiving internally-generated current control command signal CCUDS and top bank selection signal TBS when the current control command CC is applied and generating internal current control command signal CC_tb and CC_bb. The top bank selection signal TBS becomes 'high' only when finally-received read command is to top memory bank unit 60 (when the bank address of MSB is high).

When current control command CC is performed, serial/parallel shifter used by the prior read command, is employed as top and bottom serial/parallel shifter units 40 and 50.

The first enable signal generation unit 130 receives internal read command signal RO_tb and RO_bb from the first top/bottom separation unit 110, internal current control command signal CC_tb and CC_bb from the second top/bottom separation unit 120, reset bar signal Reset_b, read active signal R_act, current command active signal CC_act, control signal EN and clock signal rclk, and generates top read clock signal R_top to the serial/parallel shifter unit 40 when read or current command is applied to top memory bank unit 60.

That is, when read or current control command CC is received to top memory bank unit 60, the first enable signal generation unit 130 for the top memory bank unit 60 sets the top read clock signal R_top to 'high' and operates clock connected to the top serial/parallel shifter unit 40.

The bottom memory bank signals are outputted with top memory bank signals such as internal read command signal RO_tb and internal current control command signal CC_tb to the first enable signal generation unit 130 since top read clock signal R_top and bottom read clock signal R_bot are required to set to 'high' before signals to each command are separated into two signals in the first top/bottom separation unit 110 and the second top/bottom separation unit 120. The timing of top read clock signal R_top is controlled by read active signal R_act and current control active signal CC_act enabled 1 cycle prior to 4 signals generated in the first top/bottom separation unit 110 and the second top/bottom separation unit 120.

That is, when one of read active signal R_act and current control active signal CC_act becomes active, both of top read clock signal R_top and bottom read clock signal R_bot are enabled and, after one cycle, one of the signals becomes 'high' and the other is disabled according to 4 developed signals outputted from the first top/bottom separation unit 110 and the second top/bottom separation unit 120.

The second enable signal generation unit 140 receives internal read command signal RO_tb and RO_bb from the first top/bottom separation unit 110, internal current command signal CC_tb, CC_bb from the second top/bottom separation unit 120, reset bar signal Reset_b, clock signal rclk and signals S1 and S2 from the first enable signal generation unit 130, and generates top read clock signal R_bot to the bottom serial/parallel shifter unit 50 when read or current command for bottom memory bank unit 70 is received.

The first disable timing control unit 150 generates timing for disabling the top read clock signal R_top generated in the first enable signal generation unit 130, after a predetermined time.

The timing for disabling the top read clock signal R_top depends on the position of DRAM on Rambus channel. A timing control signal TCS and top bank selection signal TBS are employed to control the timing, wherein the timing control signal TCB has timing information to be maintained by the top read clock signal R_top to read or current control command. The top bank selection signal TBS determines whether the received command is for top memory bank unit 60 or bottom memory bank unit 70.

The first disable timing control unit 150 combines the timing control signal TCS with the top bank selection signal TBS to control disable timing of the top read clock signal R_top.

The two signals C and D are outputted from the first disable timing control unit 150 and feedback is performed to the first enable signal generation unit 130 to control disable timing of the top read clock signal R_top.

As similar to the first disable timing control unit 150, the second disable timing control unit 160 performs feedback of output signals E and F to the second enable signal generation unit 140 to control disable timing of the bottom read clock signal R_bot.

When read command or current control command is performed, internal data should be outputted to output pin. Therefore, it is required to generate signals for enabling and disabling output driver in a predetermined time. The output driver enable timing control unit 170 is proposed to perform this process.

The output driver enable timing control unit 170 receives the top read clock signal R_top and output signal A generated from the first enable signal generation unit 130, and the bottom read clock signal R_bot and output signal B generated from the second enable signal generation unit 140. When one of top read clock signal R_top and bottom read lock signal R_bot is enabled by the received signal, output signal dis_R becomes 'high' and the output driver is enabled. Then, in a timing for disabling the top read clock signal R_top or the bottom read clock signal R_bot, the output signal A generated from the first enable signal generation unit 130 and the output signal B generated from the second enable signal generation unit 140 are received, thereby setting the output signal dis_R to 'low' and disabling the output driver.

The OR gate unit 180 receives the top read clock signal R_top an the bottom read clock signal R_bot, and generates first read clock signal R1 to the DLL unit 20, wherein the first read clock signal R1 becomes 'high' when one of the received signals becomes 'high'. The first read clock signal R1 is provided as clock source R2 to select top and bottom memory banks.

FIGS. 4A to 4F are detailed circuit diagrams of circuits in FIG. 3.

Figure 4A:
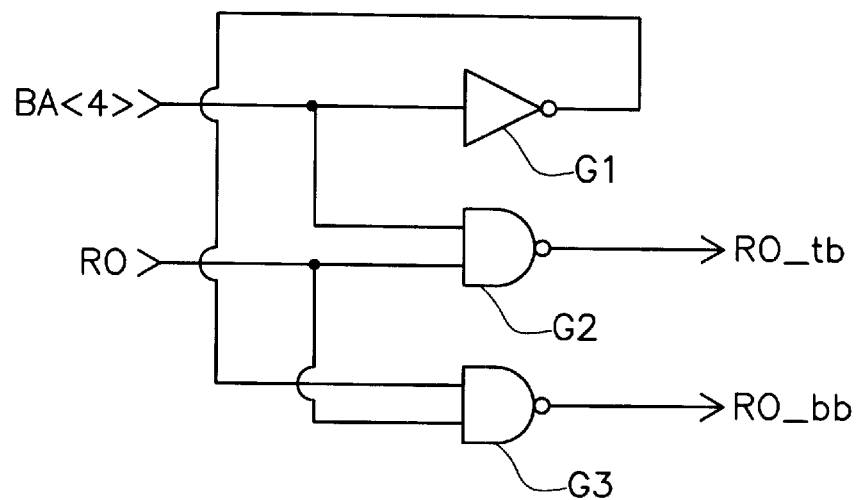
FIG. 4A is a detailed circuit diagram of first top/bottom separation unit 110 in FIG. 3.

Referring to FIG. 4A, the first top/bottom separation unit 110 comprises an inverter G1 for receiving maximum valid bit signal BA<4> of bank address and outputting the inverted signal, a NAND gate G2 for receiving the maximum valid bit signal BA<4> of bank address and read command signal RO and generating internal read command RO_tb, and a NAND gate G3 for receiving output signal of the inverter G1 and read command signal RO and generating internal read command signal RO_bb.

Figure 4B:
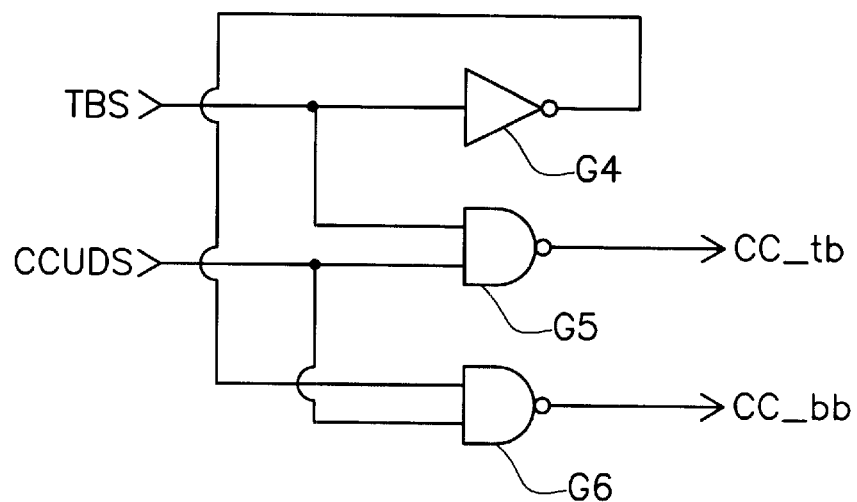
FIG. 4B is a detailed circuit diagram of second top/bottom separation unit 120 in FIG. 3.

FIG. 4B is a detailed circuit diagram of second top/bottom separation unit 120 in FIG. 3, comprising an inverter G4 for receiving top bank signal TBS becoming 'logic high' when finally-received read command is a signal for selecting top memory and outputting the inverted signal, a NAND gate G5 for receiving the top bank signal TBS and the current command signal CCUDS and generating internal current control command signal CC_tb, and a NAND gate G6 for receiving output signal of the inverter G4 and the current command signal CCUDS and generating internal current control command signal CC_bb.

Figure 4C:
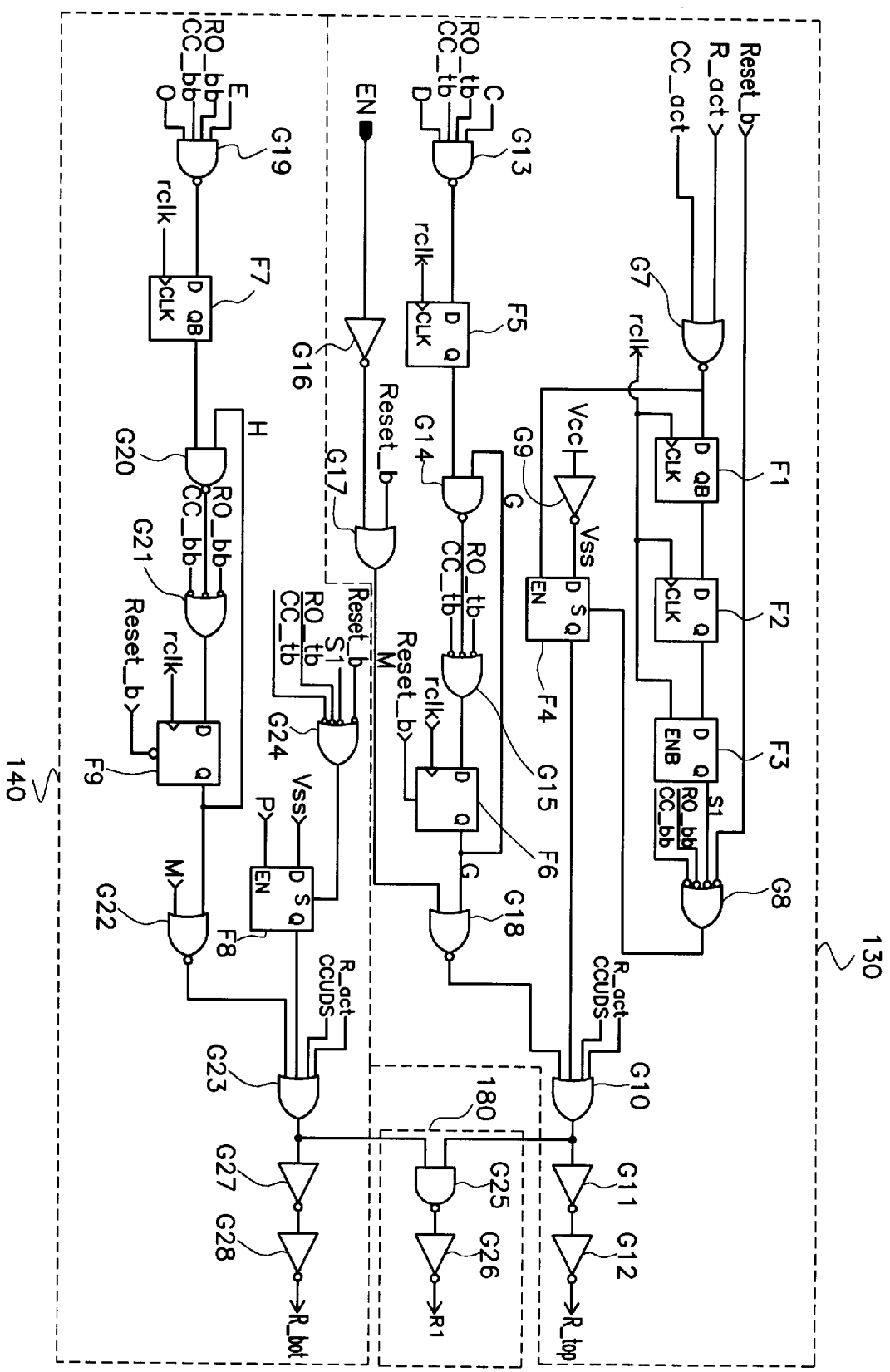
FIG. 4C is a detailed circuit diagram of first enable signal generating unit 130, second enable signal generating unit 140 and OR gate unit 180.

FIG. 4C is a detailed circuit diagram of first enable signal generation unit 130, second enable signal generation unit 140 and OR gate unit 180 in FIG. 3.

Referring to FIG. 4C, the first enable signal generation unit 130 comprises an OR gate G7 for receiving inverted signal of read active signal R_act and inverted signal of command current signal CC_act and generating OR operated signal P; a flip flop F1 for receiving output signal P from the OR gate G7 and clock signal rclk; a flip flop F2 for receiving output signal QB from the flip flop F1 and clock signal rclk; a flip flop F3 for receiving output signal Q from the flip flop F2 and clock signal rclk; an OR gate G8 for receiving output signal S1 from the flip flop F3, internal read command signal RO_bb from the first top/bottom separation unit 110 and internal current control command signal CC_bb from the second top/bottom separation unit 120 and reset bar signal Reset_b; an inverter G9 for receiving source voltage Vcc and generating ground voltage Vss; a flip flop F4 for receiving output signal Vss from the inverter G9, output signal P from the OR gate G7 and output signal from the OR gate G8; a NAND gate G13 for receiving output signal C and D from the first disable timing control unit 150, output signal RO_tb from the first top/bottom separation unit 110 and output signal CC_tb from the second top/bottom separation unit 120; a flip flop F5 for receiving output signal from the NAND gate G13 and the clock signal rclk; a NAND gate G14 for receiving output signal from the flip flop F5 and signal G; an OR gate G15 for receiving inverted signal from output signal of the NAND gate G14, inverted signal of output signal RO_tb from the first top/bottom separation unit 110 and inverted signal of output signal CC_tb from the second top/bottom separation unit 120; a flip flop F6 for receiving output signal from the OR gate G15, the clock signal rclk and the reset bar dignal Reset_b, and generating the signal G; an inverter G16 for receiving the control signal EN and outputting the inverted signal; an OR gate G17 for receiving inverted signal of the reset bar signal Reset_b and inverted signal of output signal from the inverter G16; a NOR gate G18 for receiving output signal G from the flip flop F6 and output signal from the OR gate G17; an OR gate G10 for receiving inverted signal of the read active signal R_act, inverted signal of the current command signal CCUDS, inverted signal of output signal from the flip flop F4 and inverted signal of output signal from the NOR gate G18; and inverters G11 and G12 serially connected between output terminal of the OR gate G10 and output terminal for the top read clock signal R_top.

The second enable signal generation unit 140 comprises: a NAND gate G19 for receiving internal read command signal RO_bb from the first top/bottom separation unit 110, internal current command signal CC_bb from the second top/bottom separation unit 120 and output signals E and F from the second disable timing control unit 160; a flip flop F7 for receiving output signal from the NAND gate G19 and the clock signal rclk; a NAND gate G20 for receiving output signal from the flip flop F7 and signal H; an OR gate G21 for receiving inverted signal of output signal from the NAND gate G20, inverted signal of output signal RO_bb from the first top/bottom separation unit 110 and inverted signal of output signal CC_bb from the second top/bottom separation unit 120; a flip flop F9 for receiving output signal from the OR gate G21 and the clock signal rclk and the reset bar signal Reset_b, and outputting the signal H; a NOR gate G22 for receiving output signal H from the flip flop F9 and output signal M from the OR gate G17; an OR gate G24 for receiving inverted signal of the reset bar signal Reset_b, inverted signal of output signal S1 from the flip flop F3 in the first enable signal generation unit 130, inverted signal of output signal RO_tb from the first top/bottom separation unit 110, and inverted signal of output signal CC_tb from the second top/bottom separation unit 120; a flip flop F8 for receiving the ground voltage Vss and output signal P from OR gate G7 in the first enable generation unit 130; an OR gate G23 for receiving inverted signal of output signal from the flip flop F8, inverted signal of the read active signal R_act, inverted signal of the current control command signal CCUDS, and inverted signal of output signal from the NOR gate G22; and inverters G27 and G28 serially connected between output terminal of the OR gate G23 and output signal for the bottom read clock signal R_bot.

The OR gate unit 180 comprises a AND gate G25 for receiving inverted signal of output signal from the OR gate G10 and inverted signal of output signal from the OR gate G23, and an inverter G26 for receiving output signal from the AND gate G25 and generating first read clock signal R1 to the DLL unit 20.

Figure 4D:
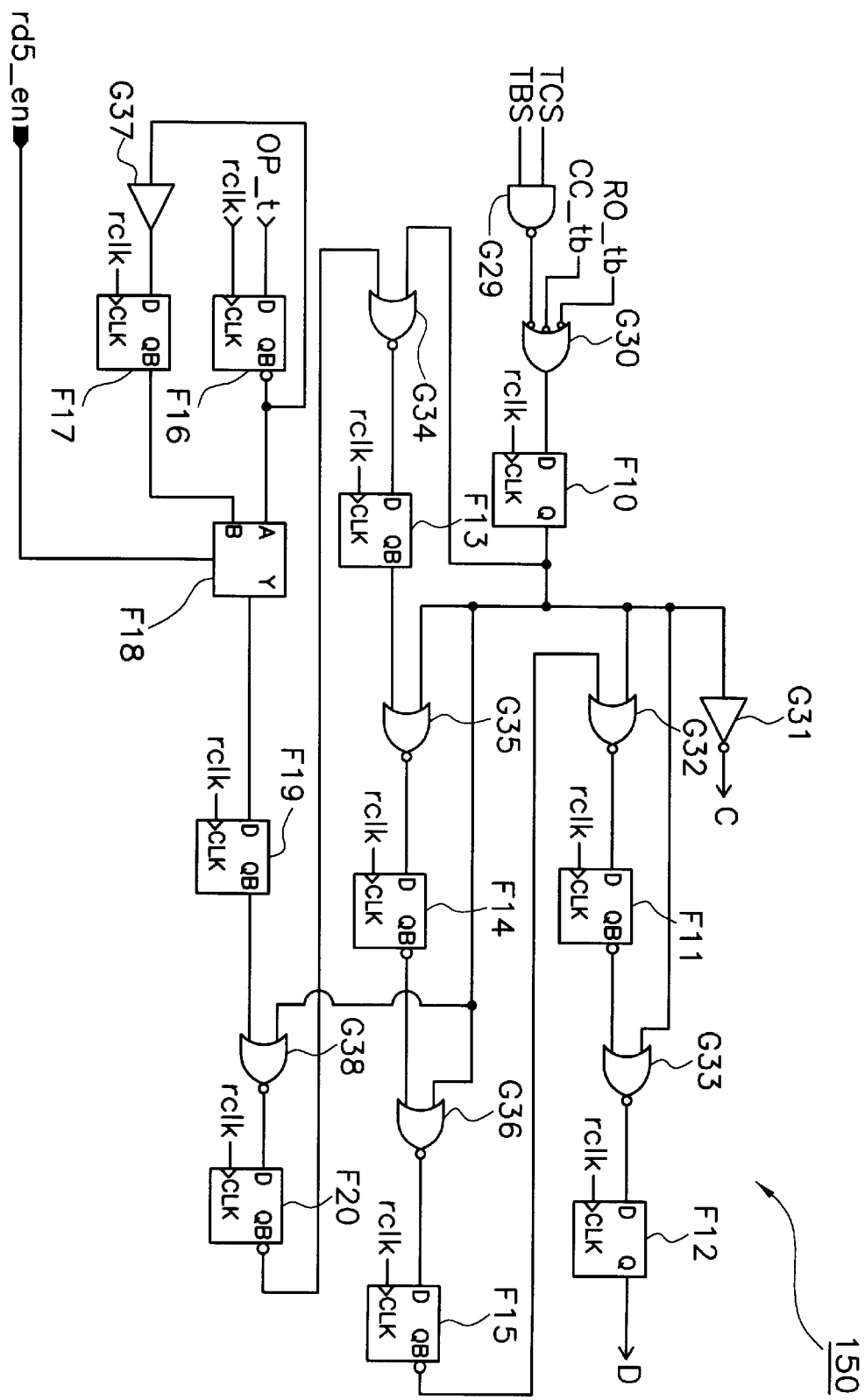
FIG. 4D is a detailed circuit diagram of first disable timing control unit 150 in FIG. 3.

FIG. 4D is a detailed circuit diagram of first disable timing control unit 150 in FIG. 3, comprising: a NAND gate G29 for receiving the timing control signal TCS and the top bank selection signal TBS; an OR gate G30 for receiving inverted signal of output signal from the NAND gate G29, inverted signal of internal read command signal RO_tb from the first top/bottom separation unit 110 and inverted signal of internal current control command signal CC_tb from the second top/bottom separation unit 120; a flip flop F10 for receiving output signal from the OR gate G30 and the clock signal rclk; a flip flop F16 for receiving control signal OP_t and clock signal rclk; a buffer G37 for receiving output bar signal QB from the flip flop F16 and outputting buffered signal; a flip flop F17 for receiving output signal from the buffer G37 and clock signal rclk; a flip flop F18 for receiving the output bar signal QB from flip flop F16 and output signal Q from the flip flop F17; a flip flop F19 for receiving output signal Q from the flip flop F18 and the clock signal rclk; a NOR gate G38 for receiving output signal Q from the flip flop F10 and output signal from the flip flop F19; a flip flop F20 for receiving output signal from the NOR gate G38 and the clock signal rclk; a NOR gate G34 for receiving the output signal QB from flip flop F20 and the output signal Q from flip flop F10; a flip flop F13 for receiving the output signal from NOR gate G34 and the clock signal rclk; a NOR gate G35 for receiving the output bar signal QB from flip flop F13 and the output signal Q from flip flop F10; a flip flop F14 for receiving the output signal from NOR gate G35 and the clock signal rclk1; a NOR gate G36 for receiving the output Q from flip flop F10 and the output bar signal QB from flip flop F14; a flip flop F15 for receiving the output from NOR gate G36 and the clock signal rclk; an inverter G31 for receiving the output signal from flip flop F10, and outputting the inverted signal C; a NOR gate G32 for receiving the output signal Q from flip flop and the output bar signal QB from flip flop F15; a flip flop F1 for receiving the output signal from NOR gate G32 and the clock signal rclk; a NOR gate G33 for receiving the output signal Q from flip flop F10 and the output bar signal QB from flip flop F11; and a flip flop F12 for receiving the output signal from NOR gate G33 and the clock signal rclk and generating signal D.

Figure 4E:
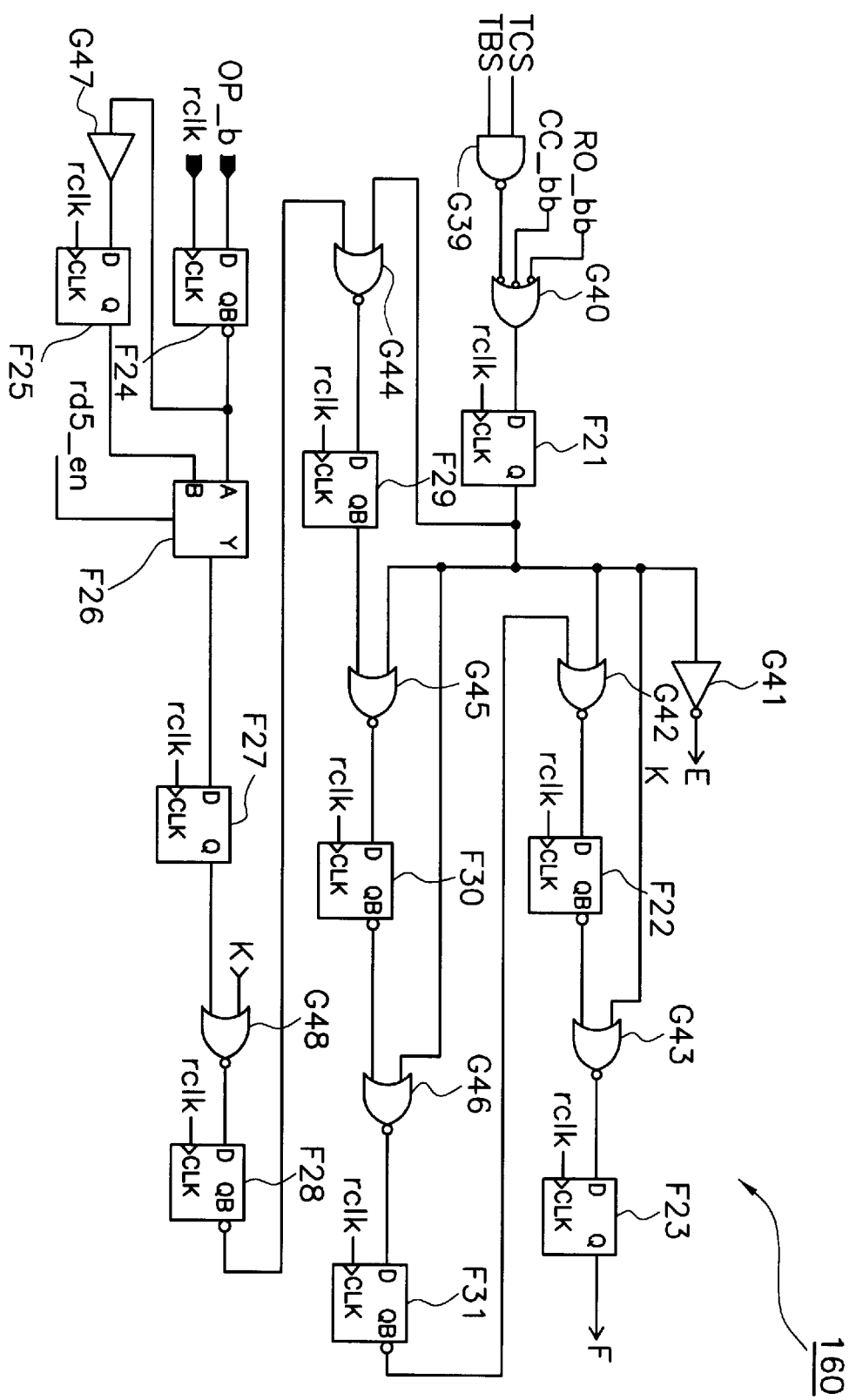
FIG. 4E is a detailed circuit diagram of second disable timing control unit 160 in FIG. 3.

FIG. 4E is a detailed circuit diagram of second disable timing control unit 160 in FIG. 3, comprising: a NAND gate G39 for receiving the timing control signal TCS and the top bank selection signal TBS; an OR gate G40 for receiving inverted signal of output signal from the NAND gate G39, inverted signal of internal read command signal RO_bb from the first top/bottom separation unit 110 and inverted signal of internal current control command signal CC_bb from the second top/bottom separation unit 120; a flip flop F21 for receiving the output signal from OR gate G40 and the clock signal rclk; a flip flop F24 for receiving the control signal OP_t and the clock signal rclk; a buffer G47 for receiving the output signal QB from flip flop F24 and outputting the buffered signal; a flip flop F25 for receiving the output signal from buffer G47 and the clock signal rclk; a flip flop F26 for receiving the output bar signal QB from flip flop F24 and the output signal Q from flip flop F25; a flip flop F27 for receiving the output signal Y from flip flop F26 and the clock signal rclk; a NOR gate G48 for receiving the output signal Q from flip flop F 27 and the output signal K from flip flop F21; a flip flop F28 for receiving the output signal from NOR gate G48 and the clock signal rclk; a NOR gate G44 for receiving the output signal QB from flip flop F28 and the output signal K from flip flop F21; a flip flop F29 for receiving the output signal from NOR gate G44 and the clock signal rclk; a NOR gate G45 for receiving the output signal QB from flip flop F29 and the output signal Q from flip flop F21; a flip flop F30 for receiving the output signal from NOR gate G45 and the clock signal rclk; a NOR gate G 46 for receiving the output signal K from flip flop F21 and the output signal QB from flip flop F30; a flip flop F31 for receiving the output signal from NOR gate G46 and the clock signal rclk; an inverter G41 for receiving the output signal K from flip flop F21 and outputting the inverted signal E; a NOR gate G42 for receiving the output signal K from flip flop F21 and the output signal QB from flip flop F31; a flip flop F22 for receiving the output signal from NOR gate G42 and the clock signal rclk; a NOR gate G43 for receiving the output signal K from flip flop F21 and the output signal QB from flip flop F22; and a flip flop F23 for receiving the output signal from NOR gate G43 and the clock signal rclk and generating signal F.

Figure 4F:
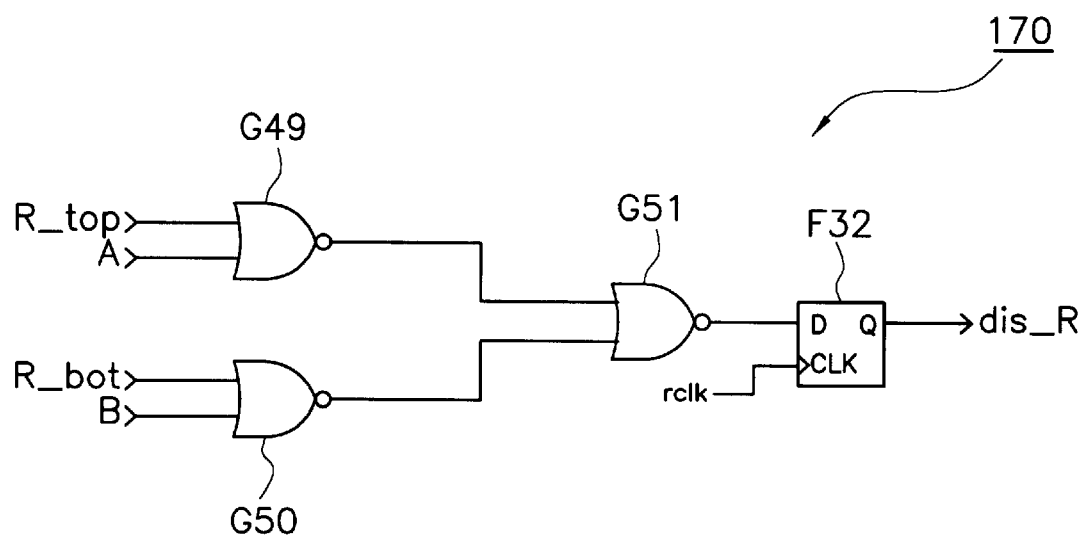
FIG. 4F is a detailed circuit diagram of output driver enable timing control unit 170 in FIG. 3.

FIG. 4F is a detailed circuit diagram of output driver enable timing control unit 170 in FIG. 3, comprising: a NOR gate G49 for receiving output signal R_top (A) from the first enable signal generation unit 130; a NOR gate G50 for receiving output signal R_bot (B) from the second enable signal generation unit 140; a NOR gate G51 for receiving output signal from the NOR gate G49 and the NOR gate G50; and a flip flop F32 for receiving the output signal from NOR gate G51 and the clock signal rclk, and generating signal dis_R.

Figure 5:
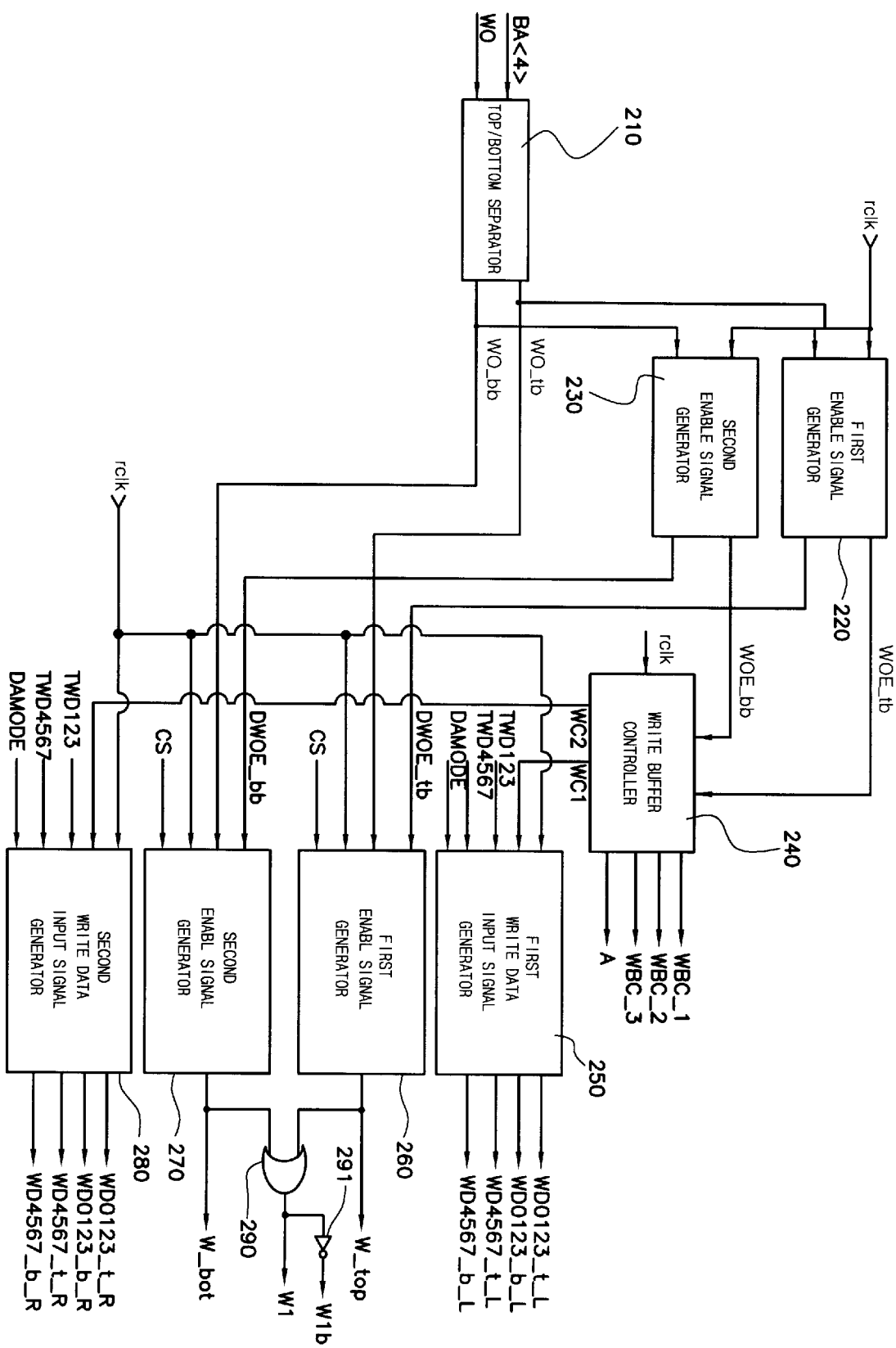
FIG. 5 is a block diagram of interface logic circuit unit in FIG. 2, showing operation path by write command.

FIG. 5 is a block diagram of interface logic circuit unit 10 in FIG. 2, showing the operation path by write command.

Referring to FIG. 5, the interface logic circuit unit 10 comprises: a top/bottom separation unit 210; first and second disable timing control units 220 and 230; a write buffer control unit 240; a first write data input signal generation unit 250; first and second enable signal generation units 260 and 270; a second write data input signal generation unit 280; an OR gate unit 290; and an inverter 291.

The top/bottom separation unit 210 receives write command signal WO and maximum valid bit signal BA<4> of bank address and generates write command signals WO_tb and WO_bb for separating top and bottom memory banks.

The first disable timing control unit 220 receives internal write command signal WO_tb from the top/bottom separation unit 210 and clock signal rclk, and generates a timing control signal DWOE_tb for disabling top write clock signal W_top and a control signal WOE_tb for controlling write buffer.

The second disable timing control unit 230 receives internal write command signal WO_bb from the top/bottom separation unit 210 and clock signal rcld, and generates a timing control signal DWOE_bb for disabling bottom write clock signal W_bot and a control signal WOE_bb for controlling write buffer.

The write buffer control unit 240 receives control signals WOE_tb and WOE_bb from first and second disable timing control units 220 and 230 and the clock signal rclk and generates 4 write buffer control signals WBC_1~WBC_3 (A) for controlling write buffer and control signals WC1, WC2 for controlling to receive write data from the external via input/output pin.

The first write data input signal generation unit 250 receives control signal WC1 from the write buffer control unit 240, the clock signal rclk, test write signal TWD0123 and TWD4567 and control signal DAMODE, and generates signals WD0123_t_L and WD0123_b_L in write data 0 to 3 WD0123 and signals WD4567_t_L and WD4567_b_L in write data 4 to 7 WD4567 for receiving write data via external pin.

The second write data input signal generation unit 280 receives control signal WC2 from the write buffer control unit 240, the clock signal rclk, the test write signals TWD0123 and TWD4567 and the control signal DAMODE and generates signals WD0123_t_R and WD0123_b_R in write data 0 to 3 WD0123 and signals WD4567_t_R and WD4567_b_R in write data 4 to 7 WD4567 for receiving write data via external pin.

The first enable signal generation unit 260 receives timing control signal DWOE_tb from the first disable timing control unit 220, internal write command signal WO_tb from the top/bottom separation unit 210, the clock signal rclk and the control signal CS to generate top write clock signal W_top and control the disable timing of the generated top write clock signal W_top.

The second enable signal generation unit 270 receives timing control signal DWOE_bb from the second disable timing control unit 230, internal write command signal WO_bb from the top/bottom separation unit 210, the clock signal rclk and the control signal CS to generate bottom write clock signal W_bot and control the disable timing of the generated bottom write clock signal W_bot.

The OR gate unit 290 receives the write clock signal W_top from the first enable signal generation unit 260 and the bottom write clock signal W_bot from the second enable signal generation unit 270 to generate a first write clock signal W1 to the DLL unit 20, and the inverter 291 receives the first write clock signal W1 from the OR gate unit 290 to output inverted signal W1b.

When a write command is received from the external, write command signal WO becomes 'high'.

As for write command, the top/bottom separation unit 210 receives maximum valid bit signal BA<4> of bank address with the write command signal WO to generate internal write command signals WO_tb and WO_bb for separating top memory bank and bottom memory bank.

If the received bank address BA<4> is 'high', the internal write command signal WO_tb is enabled to 'low' and the internal write command signal WO_bb is disabled to 'high'.

The first disable timing control unit 220 receives internal write command signal WO_tb from the top/bottom separation unit 210, and generates timing control signal DWOE_tb to the first enable signal generation unit 260 for disabling top write clock signal W_top generated in the first enable signal generation unit 260.

The second disable timing control unit 230 receives internal write command signal WO_bb from the top/bottom separation unit 210, and generates timing control signal DWOE_bb to the second enable signal generation unit 270 for disabling bottom write clock signal W_bot generated in the second enable signal generation unit 270.

The write buffer control unit 240 receives control signals WOE_tb and WOE_bb from first and second disable timing control units 220 and 230, and generates 4 write buffer control signals WBC_1~WBC_3 (A) for controlling internal write buffer. And, the write buffer control unit 240 generates control signals WC1 and WC2 for controlling to receive write data from the external via input/output pin.

The first write data input signal generation unit 250 and the second write data input signal generation unit 280 receive the control signals WC1 and WC2 from the write buffer control unit 240 and generate signal WD0123 in write data 0 to 3 and signal Wd4567 in write data 4 to 7 for receiving write data via external pin. The first write data input signal generation unit 250 and the second write data input signal generation unit 280 are separated to receive external data DQA and DQB, respectively.

The first enable signal generation unit 260 receives internal write command signal WO_tb from the top/bottom separation unit 210, and generates top write clock signal W_top for driving the top serial/parallel shifter unit 40. And, the first enable signal generation unit 260 receives the timing control signal DWOE_tb from the first disable timing control unit 220 to control the disable timing of the top write clock signal W_top.

The second enable signal generation unit 270 receives internal write command signal WO_bb from the top/bottom separation unit 210, and generates bottom write clock signal W_bot for driving the bottom serial/parallel shifter unit 50. And, the second enable signal generation unit 270 receives the timing control signal DWOE_bb from the second disable timing control unit 230 to control the disable timing of the top write clock signal W_bot.

The OR gate unit 290 receives the top write clock signal W_top from the first enable signal generation unit 260 and the bottom write clock signal W_bot from the second enable signal generation unit 270 to generate a first write clock signal W1 to the DLL unit 20.

Figure 6A:
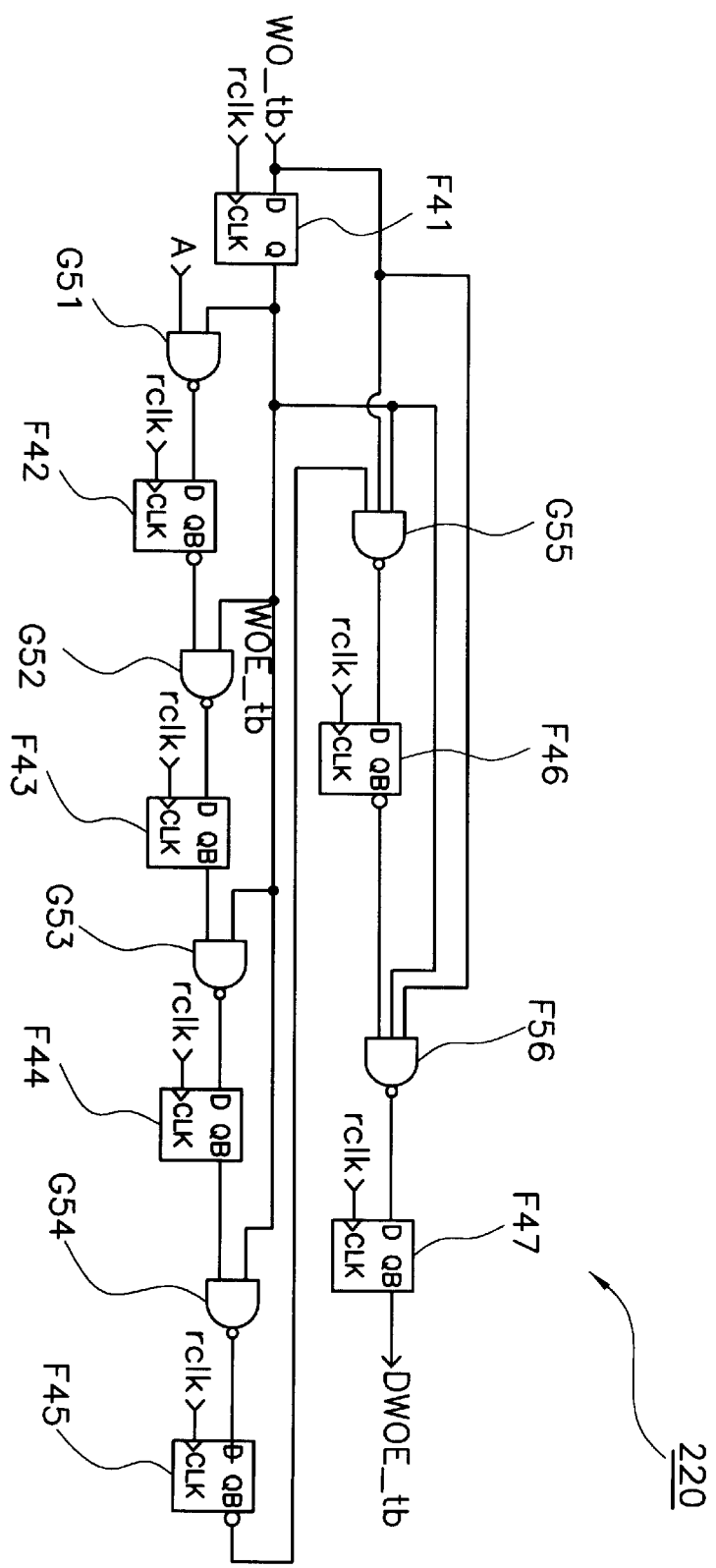
FIG. 6A is a detailed circuit diagram of first disable timing control unit 220 in FIG. 5.

FIG. 6A is a detailed circuit diagram of first disable timing control unit 220 in FIG. 5, comprising: a flip flop F41 for receiving the internal write command signal WO_tb from the top/bottom separation unit 210 and clock signal rclk, and generating command signal WOE_tb; a NAND gate G51 for receiving the control signal WOE_tb from the flip flop F41 and signal A from the write buffer control unit 240; a flip flop F42 for receiving the output signal from the NAND gate G51 and clock signal rclk; a NAND gate G52 for receiving the control signal WOE_tb from the flip flop F41 and the output signal from the flip flop F42; a flip flop F43 for receiving the output signal from the NAND gate G52 and clock signal rclk; a NAND gate G53 for receiving the control signal WOE_tb from the flip flop F41 and the output signal from the flip flop F43; a flip flop F44 for receiving the output signal from the NAND gate G53 and the clock signal rclk; a NAND gate G54 for receiving the control signal WOE_tb from the flip flop F41 and the output signal from the flip flop F44; a flip flop F45 for receiving the output signal from the NAND gate G54 and the clock signal rclk; a NAND gate G55 for receiving the output signal from the flip flop F45, internal write command signal WO_tb, and the control signal WOE_tb from the flip flop F41; a flip flop F46 for receiving the output signal from the NAND gate G55 and the clock signal rclk; a NAND gate F56 for receiving the internal write command signal WO_tb, the control signal from the flip flop F41 and the output signal from the flip flop F46; and a flip flop F47 for receiving the output signal from the NAND gate F56 and the clock signal rclk to generate the timing control signal DWOE_tb.

Figure 6B:
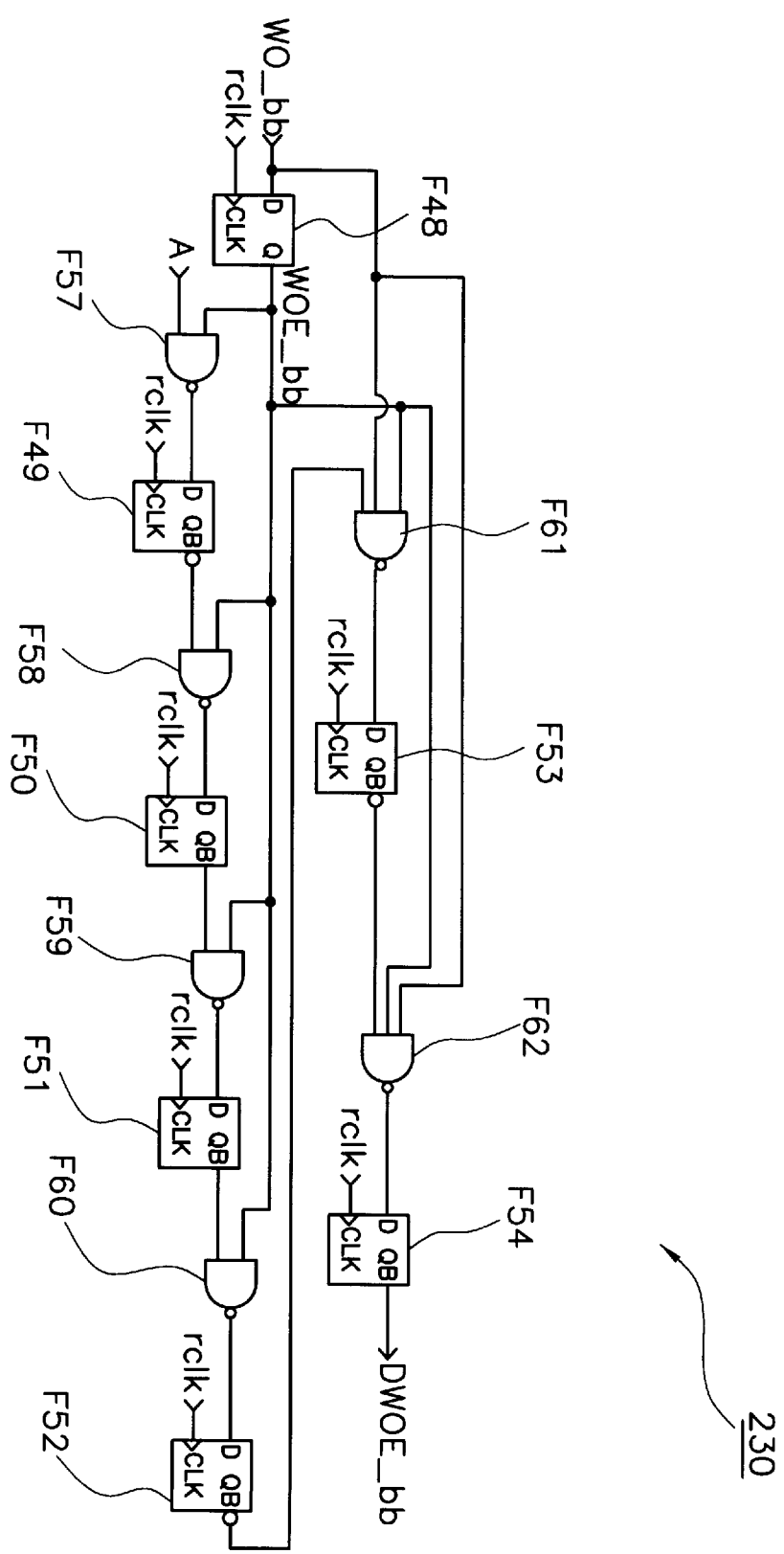
FIG. 6B is a detailed circuit diagram of second disable timing control unit 230 in FIG. 5.

FIG. 6B is a detailed circuit diagram of second disable timing control unit 230 in FIG. 5, comprising: a flip flop F48 for receiving the internal write command signal WO_bb from the top/bottom separation unit 210 and the clock signal rclk, and generating the control signal WOE_bb; a NAND gate G57 for receiving the control signal WOE_bb from the flip flop F48 and the signal A from the write buffer control unit 240; a flip flop F49 for receiving the output signal from NAND gate G57 and the clock signal rclk; a NAND gate G58 for receiving the control signal WOE_tb from the flip G58 for receiving the control signal WOE_tb from the flip flop F48 and the output signal from flip flop F49; a flip flop F50 for receiving the output signal from NAND gate G58 and the clock signal rclk; a NAND gate G59 for receiving the control signal WOE_tb from the flip flop F48 and the output signal from flip flop F50; a flip flop F51 for receiving the output signal from NAND gate G50 and the clock signal rclk; a NAND gate G60 for receiving the control signal WOE_tb from the flip flop F48 and the output signal from flip flop F51; a flip flop F52 for receiving the output signal from NAND gate G60 and the clock signal rclk; a NAND gate F61 for receiving the output signal from flip flop F52, the internal write command signal WO_bb and the control signal WOE_bb from the flip flop F48; a flip flop F53 for receiving the output signal from NAND gate G61 and the clock signal rclk; a NAND gate F62 for receiving the internal write command signal WO_bb, the control signal WOE_bb from the flip flop F48 and the output signal from the flip flop F53; and a flip flop F54 for receiving the output signal from the NAND gate F62 and the clock signal rclk to generate the timing control signal DWOE_bb.

Figure 6C:
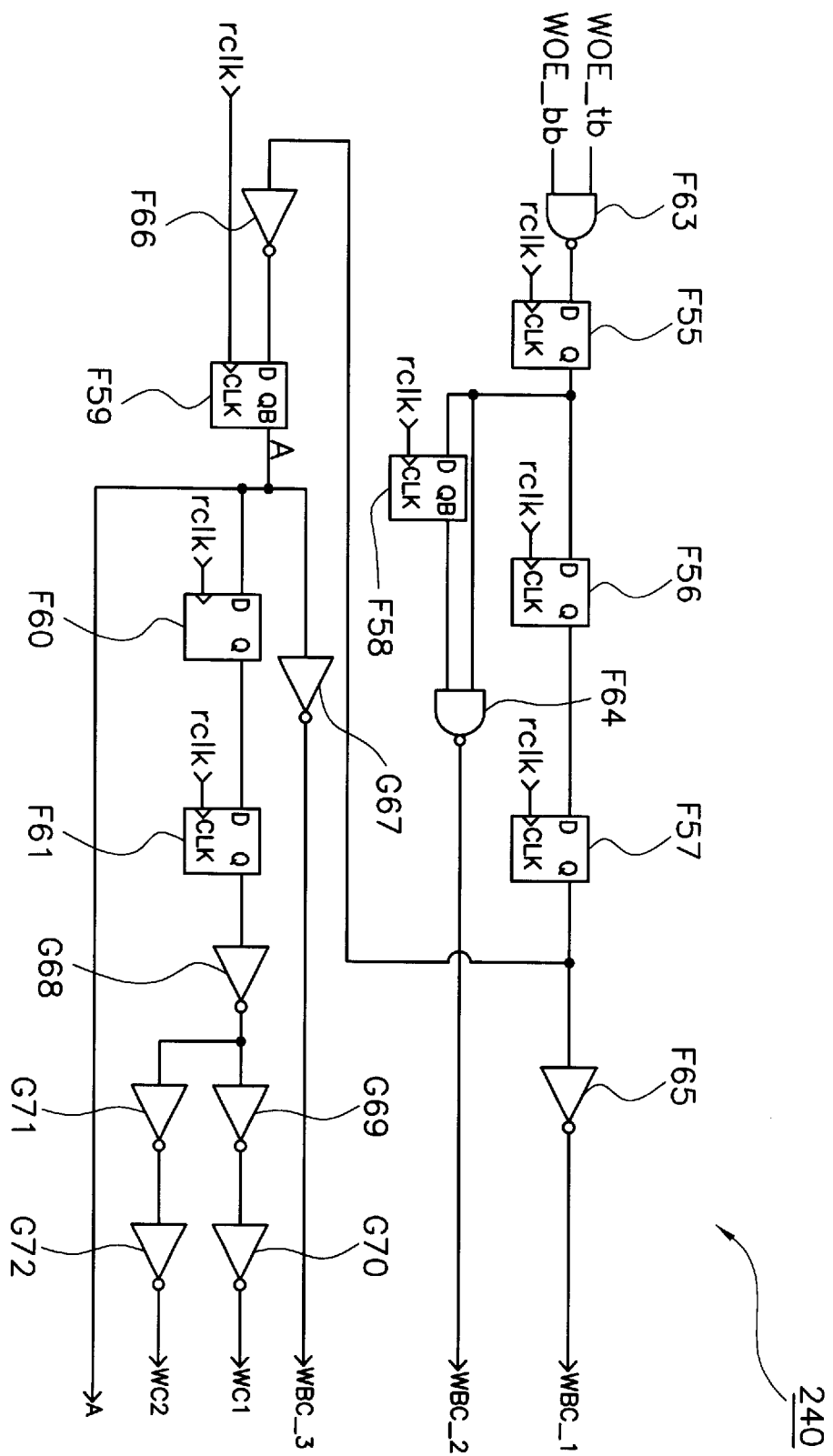
FIG. 6C is a detailed circuit diagram of write buffer control unit 240 in FIG. 5.

FIG. 6C is a detailed circuit diagram of write buffer control unit 240 in FIG. 5, comprising: a NAND gate F63 for receiving the control signals WOE_tb and WOE_bb from the first and the second disable timing control units 220 and 230; a flip flop F55 for receiving the output signal from the NAND gate F63 and the clock signal rclk; a flip flop F56 for receiving the output signal from the flip flop F55 and the clock signal rclk; a flip flop F57 for receiving the output signal from the flip flop F56 and the clock signal rclk; an inverter F65 for receiving the output signal from the flip flop F57 and generating the inverted write buffer control signal WBC_1; a flip flop F58 for receiving the output signal from the flip flop F55 and the clock signal rclk; a NAND gate F64 for receiving the output signal from the flip flop F55 and the output signal from the flip flop F58 and generating write buffer control signal WBC_2; a buffer F66 for receiving the output signal from the flip flop F57 and generating the buffered signal; a flip flop F59 for receiving the output signal from the buffer F66 and the clock signal rclk; an inverter G67 for receiving the output signal from the flip flop F59 and generating the inverted write buffer control signal WBC_3; a flip flop F60 for receiving the output signal from the flip flop F59 and the clock signal rclk; a flip flop F61 for receiving the output signal from the flip flop F60 and the clock signal rclk; an inverter G68 for receiving the output signal from the flip flop F61 and generating the inverted signal; inverters G69 and G70 serially connected between the output terminal of the inverter G68 and the output terminal of the control signal WC1; and inverters G71 and G72 serially connected between the output terminal of the inverter G68 and the output terminal of the control signal WC2.

Figure 6D:
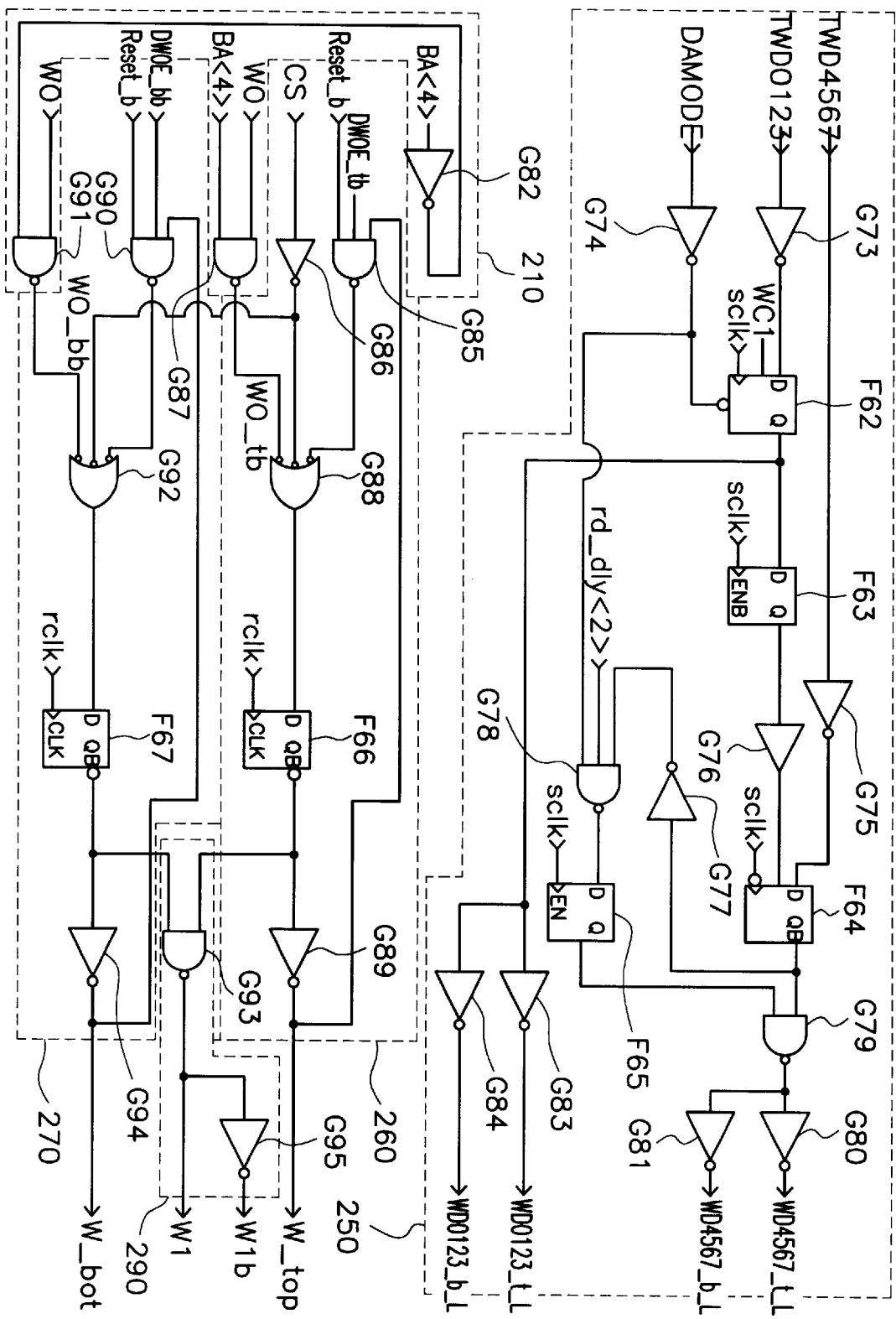
FIG. 6D is a detailed circuit diagram of top/bottom separation unit 210, first write data input signal generating unit 250, first enable signal generating unit 260 and second enable signal generating unit 270 in FIG. 5.

FIG. 6D is a detailed circuit diagram of top/bottom separation unit 210, first write data input signal generation unit 250, first enable signal generation unit 260, second enable signal generation unit 270, and OR gate unit 290.

In the drawing, the top/bottom separation unit 210 comprises: an inverter G82 for receiving maximum valid bit signal BA<4> of bank address and outputting the inverted signal; a NAND gate G87 for receiving the write command signal WO and the maximum valid bit signal BA<4> of bank address; and a NAND gate G91 for receiving the write command signal WO and output signal of the inverter G82.

The first write data input signal generation unit 250 comprises: an inverter G73 for receiving the test write signal TWD0123 and outputting the inverted signal; an inverter G74 for receiving the control signal DAMODE and outputting the inverted signal; a flip flop F62 for receiving the output signal from the inverter G73, the output signal from the inverter G74, the control signal WC1 from the write buffer control unit 240 and the clock signal rclk; a flip flop F63 for receiving the output signal from the flip flop F62 and the clock signal rclk; a buffer G76 for receiving the output signal from the flip flop F63 and outputting the buffered signal; an inverter G75 for receiving the test write signal TWD4567 and outputting the inverted signal; a flip flop F64 for receiving the output signal from the inverter G75, the output signal of the buffer G76 and the clock signal rclk; an inverter G77 for receiving the output signal from the flip flop F64 and outputting the inverted signal; a NAND gate G78 for receiving the output signal from the inverter G77, the output signal of the inverter G74 and the control signal rd_dly<2>; a flip flop F65 for receiving the output signal from the NAND gate G78 and the clock signal rclk; a NAND gate G79 for receiving the output signal from the flip flop F64 and output signal of the flip flop F65; an inverter G80 for receiving the output signal from the NAND gate G79 and generating the write data input signal WD4567_t_L; an inverter G81 for receiving the output signal from the NAND gate G79 and generating the write data input signal WD4567_b_L; an inverter G83 for receiving the output signal from the flip flop F62 and generating the write data input signal WD0123_t_L; and an inverter G84 for receiving the output signal from the flip flop F62 and generating the write data input signal WD0123_b_L.

The first enable signal generation unit 260 comprises: a NAND gate G85 for receiving the timing control signal DWOE_tb from the first disable timing control unit 220, the reset bar signal Reset_b and the top write clock signal W_top; an inverter G86 for receiving the control signal CS and outputting the inverted signal; an OR gate G88 for receiving the inverted signal from output signal of the inverter G86, the inverted signal of internal write command signal WO_tb from the NAND gate G87 of the top/bottom separation unit 210 and the inverted signal of output signal from the NAND gate G85; a flip flop F66 for receiving the output signal from the OR gate G88 and the clock signal rclk; and an inverter G89 for receiving and inverting the output signal from the flip flop F66 to generate the top write clock signal W_top.

The second enable signal generation unit 270 comprises: a NAND gate G90 for receiving the timing control signal DWOE_bb from the second disable timing control unit 230, the reset bar signal Reset_b and the bottom write clock signal W_bot; an OR gate G92 for receiving the inverted signal of output signal from the NAND gate G90, the inverted signal of output signal from the inverter G86 and the inverted signal of internal write command signal WO_bb from the NAND gate G91 of the top/bottom separation unit 210; a flip flop F67 for receiving the output signal from the OR gate G92 and the clock signal rclk; and an inverter G94 for receiving and inverting the output signal from the flip flop F67 to generate the bottom write clock signal W_bot.

Referring to FIG. 5, the OR gate unit 290 comprises an OR gate 290 for receiving the top write clock signal W_top from the first enable signal generation unit 260 and the bottom write enable signal W_bot from the second enable signal generation unit 270 to generate a first write clock signal W1. As shown in FIG. 6D, the OR gate unit 290 may comprise a NAND gate G93 for receiving the output signal from flip flop F66 in the first enable signal generation unit 260 and the output signal from flip flop F67 in the second enable signal generation unit 270.

Figure 6E:
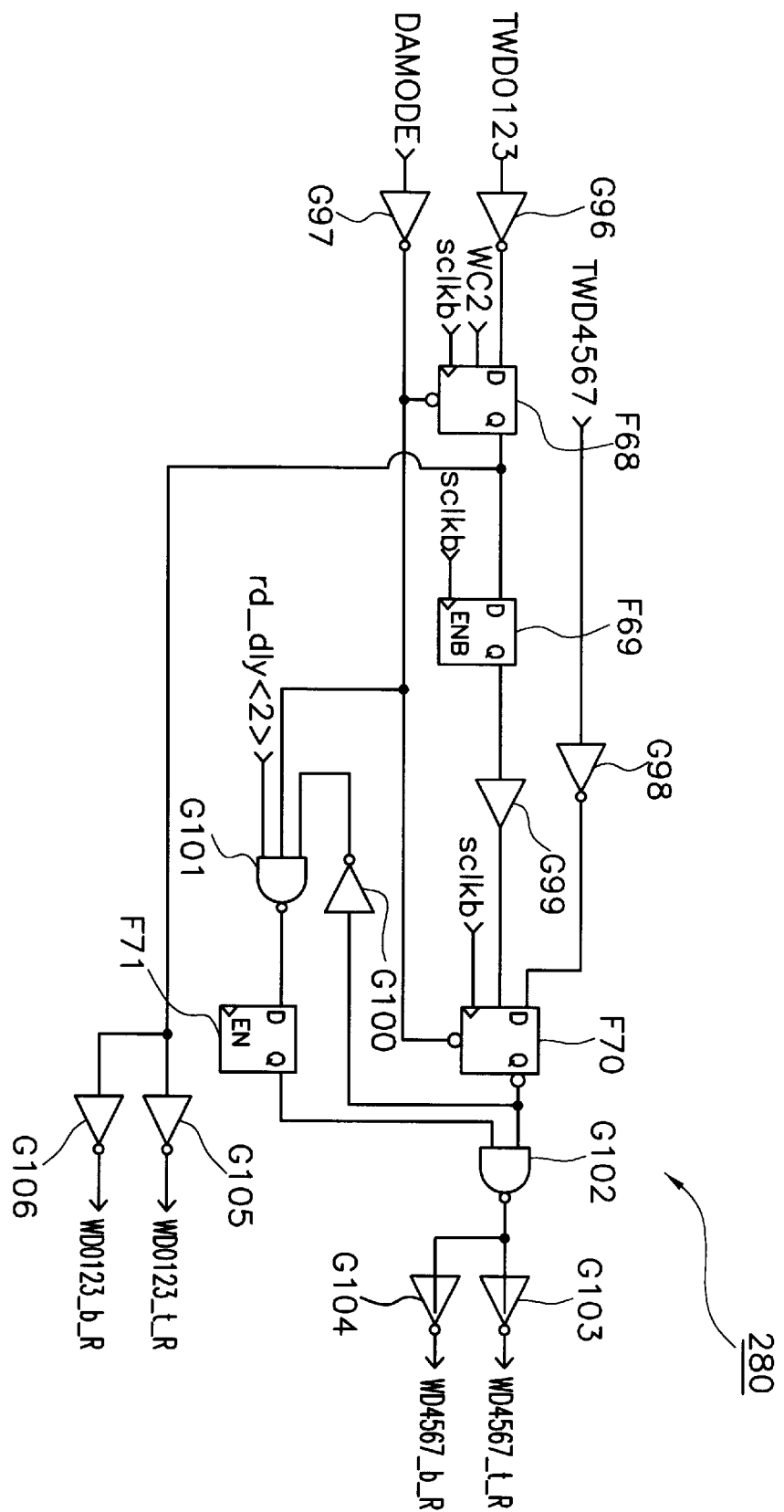
FIG. 6E is a detailed circuit diagram of second write data input signal generating unit 280 in FIG. 5.

FIG. 6E is a detailed circuit diagram of second data input signal generation unit 280 in FIG. 5, comprising: an inverter G96 for receiving the test write signal TWD0123 and outputting the inverted signal; an inverter G97 for receiving the control signal DAMODE and outputting the inverted signal; a flip flop F68 for receiving the output signal from the inverter G96, the output signal from the inverter G97, the control signal WC2 from the write buffer control unit 240 and clock signal rclk; a flip flop F69 for receiving the output signal from the flip flop F68 and the clock signal rclk; a buffer G99 for receiving the output signal from the flip flop F69 and outputting the buffered signal; an inverter G98 for receiving the test write signal TWD4567 and outputting the inverted signal; a flip flop F70 for receiving the output signal from the inverter G98, the output signal from the buffer G99 and the clock signal rclk; an inverter G100 for receiving the output signal from the flip flop F70 and outputting the inverted signal; a NAND gate G101 for receiving the output signal from the inverter G100, the output signal from the inverter G97, and the control signal rd_dly<2>; a flip flop F71 for receiving the output signal from the NAND gate G101 and the clock signal rclk; a NAND gate G102 for receiving the output signal from the flip flop F70 and the output signal from the flip flop F71; an inverter G103 for receiving the output signal from the NAND gate G102, and generating the write data input signal WD4567_t_R; an inverter G104 for receiving the output signal from the NAND gate G102 and generating the write data input signal WD4567_b_R; an inverter G105 for receiving the output signal from the flip flop F68 and generating the write data input signal WD0123_t_R; and an inverter G106 for receiving the output signal from the flip flop F68 and generating the write data input signal WD0123_b_R.

Figure 7:
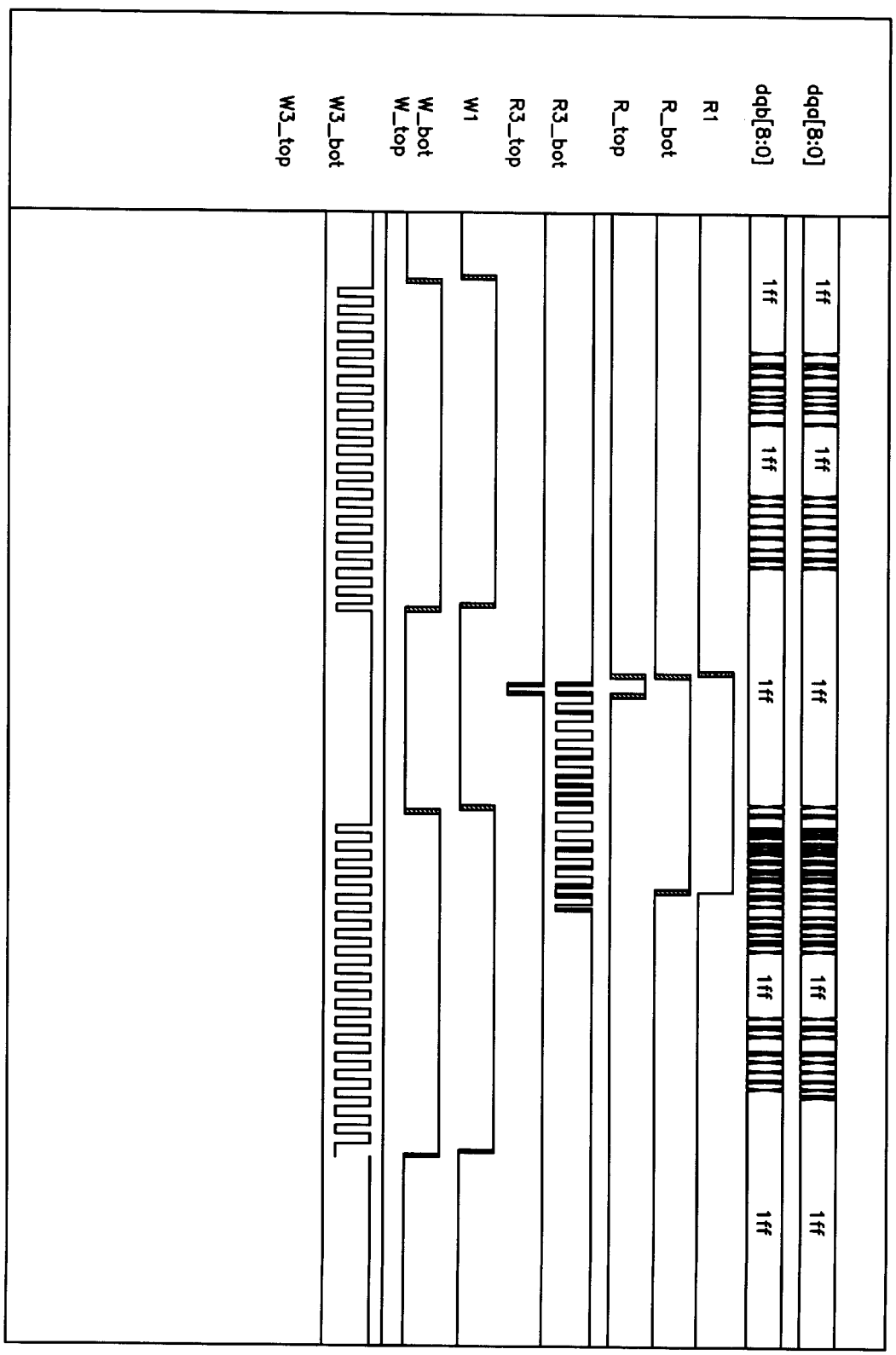
FIG. 7 is an operation timing diagram showing the post-layout simulation result by interface logic circuit of Rambus DRAM according to the present invention.

FIG. 7 is an operation timing diagram showing the result of post-layout simulation in the interface logic circuit according to the present invention.

Referring to FIG. 7, when the bottom write clock signal W_bot is 'high', the first write clock signal W1 becomes 'high', thereby generating clock signal W2 to DLL unit 20. The clock signal W2 is buffered in the I/O unit 30 to operate only bottom write selection signal W3_bot as the clock signal and disable top write selection signal W3_top to 'high'.

When the bottom read clock signal R_bot is enabled to 'high', the first read clock signal R1 becomes 'high', thereby generating clock signal R2 to DLL unit 20. The clock signal R2 is also buffered in the I/O unit 30 to operate only bottom read selection signal R3_bot as the clock signal and disable top read selection signal R3_top to 'high'.

The bottom serial/parallel shifter unit 50 is operated by the bottom write selection signal W3_bot and the bottom read selection signal R3_bot, and the top serial/parallel shifter unit 50 is operated by the top write selection signal W3_top and the top read selection signal R3_top.

As described above, according to the present invention, it is possible to control the top and bottom serial/parallel shifter blocks to respectively operate according to received bank address, thereby reducing power consumption by 50 mA and increasing the yield.

Moreover, in the present invention, the clock signal tclk is enabled only at the read command and current control command requiring clock signal tclk, thereby reducing additional power consumption.

Although the preferred embodiment of this invention has been disclosed for illustrative purpose, those skilled in the art will appreciate that various modifications, additions and substitutions are possible, without departing from the scope and spirit of the invention.

What is claimed is:

1. A low power type Rambus DRAM comprising: a top memory bank unit comprising a plurality of banks for storing data; a bottom memory bank unit comprising a plurality of banks for storing data; a top serial/parallel shifter unit connected between the top memory bank unit and input/output block unit for converting data received by read or write command into serial or parallel data and outputting the result; and a bottom serial/parallel shifter unit connected between the bottom memory bank unit and input/output block unit for converting data received by read or write command into serial or parallel data and outputting the result, the Rambus DRAM including an interface logic circuit unit for generating first read clock signal R1 and top read selection signal R_top or bottom read selection signal R_bot for selecting the top or the bottom memory bank unit according to read command received from the external and generating first write clock signal W1 and top write selection signal W_top or bottom write selection signal W_bot for selecting the top or the bottom memory bank unit according to write command received from the external;

a delay lock loop (DLL) unit for receiving the first write clock signal W1 to generate first write clock signal W2 and receiving the first read clock signal R1 to generate synchronized second read clock signal R2; and an input/output block unit for generating signals for selectively controlling the operation of top serial/parallel shifter unit or bottom serial/parallel shifter unit by buffering the first write clock signal W2 or the first read clock signal R2 received from the DLL according to the top read selection signal R_top, the bottom read selection signal R_bot, the top write selection signal W_top and the bottom write selection signal W_bot received from the interface logic circuit unit.

2. The low power type Rambus DRAM according to claim 1, wherein the input/output block unit generates signal for driving the top serial/parallel shifter unit by the top write selection signal W_top or the top read selection signal R_top and generates signal for driving the bottom serial/parallel shifter unit by the bottom write selection signal W_bot or the bottom read selection signal R_bot.

3. The low power type Rambus DRAM according to claim 1, wherein the interface logic circuit unit comprises
   an enable control unit for controlling to enable one of the top read clock signal and the bottom read clock signal according to bank address received with read or current control command; and
   an output driver enable timing control unit for controlling to disable the enabled top read clock signal R_top or bottom read clock signal R_bot after a predetermined time.

4. The low power type Rambus DRAM according to claim 3, wherein the enable control unit comprises:
   a first top/bottom separation unit for receiving read command signal RO and maximum valid bit of bank address BA<4> and generating internal command signal RO_tb, RO_bb to separate top and bottom memory banks;
   a second top/bottom separation unit, in a case that current command signal CCUDS and finally-received read command are signals for selecting top of memory, for receiving the activated top bank signal TBS and generating internal current command signal CC_tb and CC_bb to select top or bottom serial/parallel shifter unit used in a prior read command when a current command CC is performed;
   a first enable signal generation unit for receiving internal read command signal RO_tb and RO_bb from the first top/bottom separation unit, internal current command signal CC_tb and CC_bb from the second top/bottom separation unit, reset bar signal Reset_b, read active signal R_act, current command active signal CC_act, control signal EN and clock signal rclk, and generating top read clock signal R_top to the top serial/parallel shifter unit when read or current command for the top memory bank unit is received;
   a second enable signal generation unit for receiving internal read command signal RO_tb and RO_bb from the first top/bottom separation unit, internal current command signal CC_tb and CC_bb from the second top/bottom separation unit, the reset bar signal Reset_b, the clock signal rclk and signals S1 and S2 from the first enable signal generation unit, and generating bottom read clock signal R_bot to the bottom serial/parallel shifter unit when read or current command for bottom memory bank unit is received;
   a first disable timing control unit for receiving internal read command signal RO_tb from the first top/bottom separation unit, internal current command signal CC_tb from the second top/bottom separation unit, timing control signal TCS, the top bank selection signal TBS, the clock signal rclk, clock signal rd5_en and control signal OP_t and generating first and second timing control signals C and D disabling the top read clock signal R_top outputted from the first enable signal generation unit to the first enable signal generation unit after a predetermined time;
   a second disable timing control unit for receiving internal read command signal RO_tb from the first top/bottom separation unit, internal current command signal CC_tb from the second top/bottom separation unit, timing control signal TCS, the top bank selection signal TBS, the clock signal rclk, clock signal rd5_en and control signal OP_b and generating first and second timing control signals E and F disabling the top read clock signal R_bot outputted from the second enable signal generation unit to the second enable signal generation unit after a predetermined time; and
   an OR gate unit for generating enable signal R1 having 'logic high' when one of top read clock signal R_top received from the first enable signal generation unit and bottom read clock signal R_bot received from the second enable signal generation unit is enabled.

5. The low power type Rambus DRAM according to claim 4, wherein the read active signal R_act is enabled one cycle prior to the timing that internal read command signal RO_tb and RO_bb from the first top/bottom separation unit and internal current command signal CC_tb and CC_bb from the second top/bottom separation unit are enabled in read command.

6. The low power type Rambus DRAM according to claim 4, wherein the current command active signal CC_act is enabled one cycle prior to the timing that internal read command signal RO_tb and RO_bb from the first top/bottom separation unit and internal current command signal CC_tb and CC_bb from the second top/bottom separation unit are enabled in current command.

7. The low power type Rambus DRAM according to claim 3, wherein the output driver enable timing control unit receives the top read clock signal R_top and output signal A generated from the first enable signal generation unit and the bottom read clock signal R_bot and output signal B generated from the second enable signal generation unit, and generates signal dis_R for enabling output driver and disabling the output driver after a predetermined time when one of the top read clock signal R_top and the bottom read clock signal R_bot is enabled.

8. The low power type Rambus DRAM according to claim 1, wherein the interface logic circuit unit comprises:
   an enable control unit for controlling to enable one of the top write clock signal and the bottom write clock signal according to bank address received with write command; and
   an output driver enable timing control unit for controlling to disable the enabled top write clock signal W_top or the enabled bottom write clock signal after a predetermined time.

9. The low power type Rambus DRAM according to claim 8, wherein the interface logic circuit unit comprises:
   a top/bottom separation unit for receiving write command signal WO and maximum valid bit signal BA<4> of bank address and generating internal write command signal WO_tb and WO_bb to separate top and bottom memory banks;
   a first disable timing control unit for receiving internal write command signal WO_tb from the top/bottom separation unit and clock signal rclk, and generating timing control signal DWOE_tb for disabling the top write clock signal W_top and control signal WOE_tb for controlling write buffer;
   a second disable timing control unit for receiving internal write command signal WO_bb from the top/bottom separation unit and clock signal rclk, and generating timing control signal DWOE_bb for disabling bottom write clock signal W_bot and control signal WOE_bb for controlling write buffer;
   a write buffer control unit for receiving control signal WOE_tb and WOE_bb from the first and the second disable timing control unit and the clock signal rclk, and generating 4 write buffer control signals WBC_1 to WBC_3 (A) for controlling the write buffer and control signals WC1 and WC2 for controlling to receive write data from the external via input/output pin;

a first write data input signal generation unit for receiving control signal WC1 from the write buffer control unit, the clock signal rclk, test write signal TWD0123 and TWD4567 and control signal DAMODE, and generating signals WD0123_t_L and WD0123_b_L in write data 0 to 3 and signals WD4567_t_L and WD4567_b_L in write data 4 to 7 to receive write data via external pin;

a second write data input signal generation unit for receiving control signal WC2 from the write buffer control unit, the clock signal rclk, the test write signal TWD0123 and TWD4567 and the control signal DAMODE, and generating signals WD0123_t_R and WD0123_b_R in write data 0 to 3 and signals WD4567_t_R and WD4567_b_R in write data 4 to 7 to receive write data via external pin;

a first enable signal generation unit for receiving timing control signal DWOE_tb from the first disable timing control unit, internal write command signal WO_tb from the top/bottom separation unit, the clock signal rclk and the control signal CS, generating top write clock signal W_top, and controlling disable timing of the top write clock signal W_top;

a second enable signal generation unit for receiving timing control signal DWOE_bb from the second disable timing control unit, internal write command signal WO_bb from the top/bottom separation unit, the clock signal rclk and the control signal CS, generating bottom write clock signal W_bot, and controlling disable timing of the bottom write clock signal W_bot;

an OR gate unit for receiving the top write clock signal W_top from the first enable signal generation unit and the bottom write clock signal W_bot from the second enable signal generation unit, and generating first write clock signal W1 to the DLL unit; and an inverter for receiving the first write clock signal W1 from the OR gate unit, and outputting the inverted signal W1*b*.

* * * * *